(12) United States Patent
Hirai

(10) Patent No.: US 12,411,573 B2
(45) Date of Patent: Sep. 9, 2025

(54) DISPLAY SYSTEM

(71) Applicant: Panasonic Automotive Systems Co., Ltd., Kanagawa (JP)

(72) Inventor: Atsushi Hirai, Tokyo (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 0 days.

(21) Appl. No.: 18/658,722

(22) Filed: May 8, 2024

(65) Prior Publication Data

US 2024/0295937 A1  Sep. 5, 2024

Related U.S. Application Data

(63) Continuation of application No. PCT/JP2022/039870, filed on Oct. 26, 2022.

(30) Foreign Application Priority Data

Nov. 16, 2021 (JP) .................................. 2021-186361

(51) Int. Cl.
*G06F 3/041* (2006.01)
*G06F 3/044* (2006.01)
*H03M 1/12* (2006.01)

(52) U.S. Cl.
CPC ........ *G06F 3/04164* (2019.05); *G06F 3/0412* (2013.01); *G06F 3/0446* (2019.05); *H03M 1/12* (2013.01)

(58) Field of Classification Search
CPC .. G06F 3/04164; G06F 3/0446; G06F 3/0412; H03M 1/12
See application file for complete search history.

(56) References Cited

U.S. PATENT DOCUMENTS 8,717,329 B2 * 5/2014 Kitamura .............. G06F 3/0446
                                                                 345/173
9,990,080 B2    6/2018 Shin et al.
(Continued)

FOREIGN PATENT DOCUMENTS

JP    2015-170139    9/2015
JP    2016-540302    12/2016
(Continued)

OTHER PUBLICATIONS

International Search Report issued in International Pat. Appl. No. PCT/JP2022/039870, dated Dec. 27, 2022, along with an English translation thereof.

*Primary Examiner* — Peter D McLoone
(74) *Attorney, Agent, or Firm* — GREENBLUM & BERNSTEIN, P.L.C.

(57) ABSTRACT

A touch detection circuit performs detection of a touch by an object to a display device, based on a touch detection signal received from each of multiple common electrodes of the display device. One of a set of first and second common electrodes and a set of first and third common electrodes is arranged in the same column, and the other is arranged in the same row. At least one of the sets are adjacent to each other. First and second A/D conversion circuits perform A/D conversion on a signal supplied to a first input node and a signal supplied to a second input node, respectively. First, second, and third switches switch between conduction and non-conduction between the first common electrode and the first input node, between the second common electrode and the second input node, and between the third common electrode and the first input node, respectively.

21 Claims, 22 Drawing Sheets

(56) References Cited

U.S. PATENT DOCUMENTS

| | | |
|---|---|---|
| 10,001,877 B2 | 6/2018 | Noto |
| 2010/0026660 A1* | 2/2010 | Kitamura .............. G06F 3/0446 |
| | | 345/174 |
| 2015/0185810 A1* | 7/2015 | Seo ....................... G06F 3/0412 |
| | | 345/174 |
| 2015/0253927 A1 | 9/2015 | Noto |
| 2016/0283023 A1 | 9/2016 | Shin et al. |
| 2019/0171319 A1 | 6/2019 | Aoki et al. |

FOREIGN PATENT DOCUMENTS

| | | |
|---|---|---|
| JP | 2019-101713 | 6/2019 |
| KR | 2017-0015418 | 2/2017 |

\* cited by examiner

FIG. 10

|  34a | 34b | 34c | 34d | 34a | 34b | 34c |
|---|---|---|---|---|---|---|
| 0 | 0 | 0 | 0 | 0 | 0 | 0 |
| 1 | 1 | 0 | 0 | 0 | 0 | 0 |
| 2 | 10 | 18 | 15 | 11 | 6 | 0 |
| 8 | 96 | 183 | 107 | 31 | 16 | 0 |
| 9 | 93 | 178 | 102 | 27 | 14 | 0 |
| 8 | 14 | 19 | 15 | 10 | 5 | 0 |
| 3 | 2 | 0 | 0 | 0 | 0 | 0 |

SECOND MODE
(FIRST INTERPOLATION PROCESSING)

FIG. 11

|  34a | 34b | 34c | 34d | 34a | 34b | 34c |
|---|---|---|---|---|---|---|
| 0 | 0 | 0 | 0 | 0 | 0 | 0 |
| 1 | 1 | 0 | 0 | 0 | 0 | 0 |
| 2 | 10 | 18 | 23 | 11 | 6 | 0 |
| 8 | 96 | 183 | 161 | 31 | 16 | 0 |
| 9 | 93 | 178 | 153 | 27 | 14 | 0 |
| 8 | 14 | 19 | 15 | 10 | 5 | 0 |
| 3 | 2 | 0 | 0 | 0 | 0 | 0 |

SECOND MODE
(SECOND INTERPOLATION PROCESSING)

DISPLAY SYSTEM

BACKGROUND

1. Field

The present disclosure relates to a display system provided with a touch detection function and to a control device.

2. Description of the Related Art

Touch panels are known that have a plurality of X electrodes extending in the X direction and arranged at predetermined intervals in the Y direction and a plurality of Y electrodes extending in the Y direction and arranged at predetermined intervals in the X direction where positions at which the X electrodes and the Y electrodes intersect are used as detection points (see, for example, Patent Document 1). A touch panel controller performs a low-power scan on the touch detection surface, in which a plurality of lines are drawn every other line in units of lines for detection points, so as to detect the remaining lines.
[Patent Document 1] JP 2015-170139

SUMMARY

For display systems, further improvement has been required.

To solve the problem above, a display system according to one embodiment of the present disclosure includes a display device having a plurality of common electrodes arranged in a matrix and shared for image display and touch detection; and a control device that controls the display device. The control device includes a touch detection circuit that performs detection of the presence or absence of a touch made by an object to the display device, based on a touch detection signal received from each of the multiple common electrodes. The touch detection circuit includes: a first A/D conversion circuit that performs A/D conversion on a signal supplied to a first input node; and a second A/D conversion circuit that performs A/D conversion on a signal supplied to a second input node, and detects the presence or absence of a touch based on a signal A/D converted by the first A/D conversion circuit and a signal A/D converted by the second A/D conversion circuit. The multiple common electrodes have a first common electrode, a second common electrode, and a third common electrode. One of a set of the first common electrode and the second common electrode and a set of the first common electrode and the third common electrode is arranged in the same column, the other set is arranged in the same row, and the electrodes in at least one of the set of the first common electrode and the second common electrode and the set of the first common electrode and the third common electrode are adjacent to each other. The display device includes a first signal line connected to the first common electrode, a second signal line connected to the second common electrode, and a third signal line connected to the third common electrode. The control device includes: a first switch that is connected between the first signal line and the first input node and that switches between conduction and non-conduction between the first common electrode and the first input node; a second switch that is connected between the second signal line and the second input node and that switches between conduction and non-conduction between the second common electrode and the second input node; a third switch that is connected between the third signal line and the first input node and that switches between conduction and non-conduction between the third common electrode and the first input node; a first control signal line that is connected to the first switch and the second switch and switches on and off of the first switch and on and off of the second switch; and a second control signal line that is connected to the third switch and switches on and off of the third switch.

Another embodiment of the present disclosure also relates to a display system. This display system includes: a display device having multiple common electrodes arranged in a matrix and shared for image display and touch detection; and a control device that controls the display device. The control device includes a touch detection circuit that performs detection of the presence or absence of a touch made by an object to the display device, based on a touch detection signal received from each of the multiple common electrodes. The touch detection circuit includes: a first A/D conversion circuit that performs A/D conversion on a signal supplied to a first input node, and detects a touch based on a signal A/D converted by the first A/D conversion circuit. The multiple common electrodes have a first common electrode, a second common electrode, and a third common electrode. One of a set of the first common electrode and the second common electrode and a set of the second common electrode and the third common electrode is arranged in the same column, the other set is arranged in the same row, the first common electrode and the second common electrode are adjacent to each other, and the second common electrode and the third common electrode are adjacent to each other. The display device includes a first signal line connected to the first common electrode, a second signal line connected to the second common electrode, and a third signal line connected to the third common electrode. The control device includes: a first switch that is connected between the first signal line and the first input node and that switches between conduction and non-conduction between the first common electrode and the first input node; a second switch that is connected between the second signal line and the first input node and that switches between conduction and non-conduction between the second common electrode and the first input node; a third switch that is connected between the third signal line and the first input node and that switches between conduction and non-conduction between the third common electrode and the first input node; a first control signal line that is connected to the first switch and switches on and off of the first switch; a second control signal line that is connected to the second switch and switches on and off of the second switch; and a third control signal line that is connected to the third switch and switches on and off of the third switch.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIG. 10 is a diagram showing detection values in first interpolation processing in the second mode;

FIG. 11 is a diagram showing detection values in second interpolation processing in the second mode;

DETAILED DESCRIPTION

Figure 1:
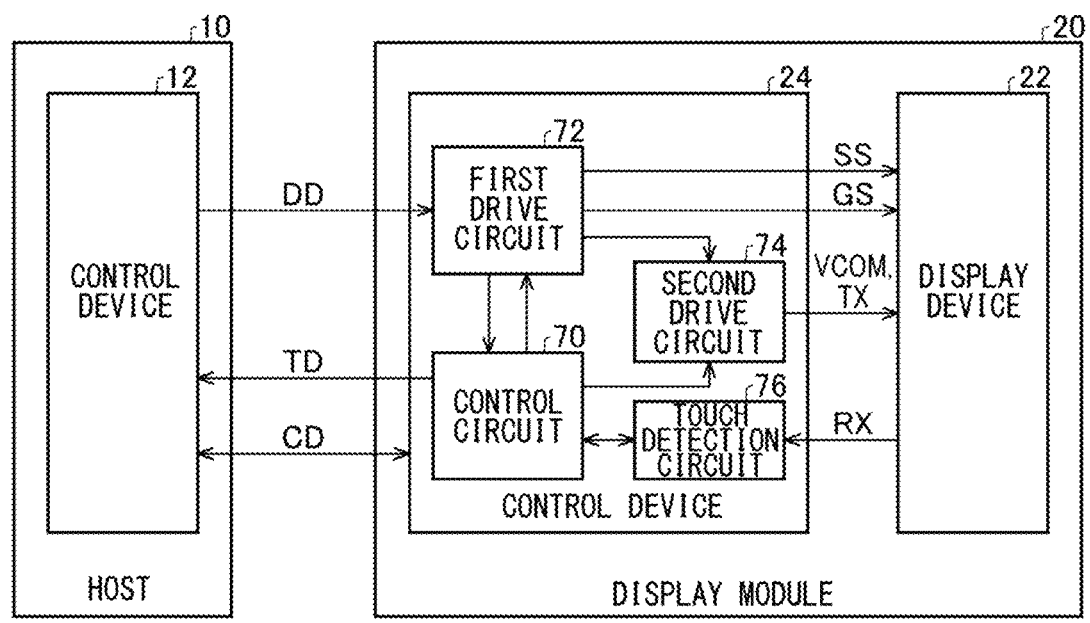
FIG. 1 is a block diagram of a display system according to the first embodiment.

The invention will now be described by reference to the preferred embodiments. This does not intend to limit the scope of the present invention, but to exemplify the invention.

Base Findings of Present Disclosure

Before specific description of embodiments is given, the base findings will be described. In an in-cell touch display, one frame period is temporally divided into multiple image display periods and multiple touch detection periods. Then, by dividing one screen into multiple touch detection regions and detecting touches in touch detection regions different for each touch detection period, touch detection for one screen is performed at least once in one frame period. The touch detection regions are also referred to as scan blocks.

In such displays, the present inventor has found that it is desirable in order to improve operability to shorten the time from when the screen is touched to when the coordinates, etc. of the touch position are output, i.e., to shorten the first touch response. In order to achieve this, a display system according to the present disclosure is configured as described below.

Like reference characters denote like or corresponding constituting elements, members, and processes in each drawing, and repetitive description will be omitted as appropriate. The dimensions of members in the drawings are shown enlarged or reduced as appropriate for ease of understanding.

First Embodiment

FIG. 1 is a block diagram of a display system 1 according to the first embodiment. Although an example will be described in which the display system 1 is a vehicle-mounted display system 1 mounted on a vehicle, such as an automobile, the application is not particularly limited, and the display system 1 may also be used for a mobile device.

The display system 1 includes a host 10 and a display module 20. The host 10 performs various functions, such as radio, car navigation, and Bluetooth (registered trademark) communication, and controls the display module 20. The host 10 includes a control device 12.

The control device 12 may be a CPU, for example, and also called a host CPU. The control device 12 supplies image data DD and control data CD to the display module 20 and controls the display module 20 based on such data.

The display module 20 includes a display device 22 and a control device 24. The display device 22 may be used as a center display, on which a car navigation screen or the like is displayed, within a vehicle cabin, for example.

The display device 22 is an in-cell liquid crystal display device of an in plane switching (IPS) type and configured as a touch display on which a touch position can be detected. The configuration of the display device 22 may be a well-known configuration as described below, for example.

Figure 2:
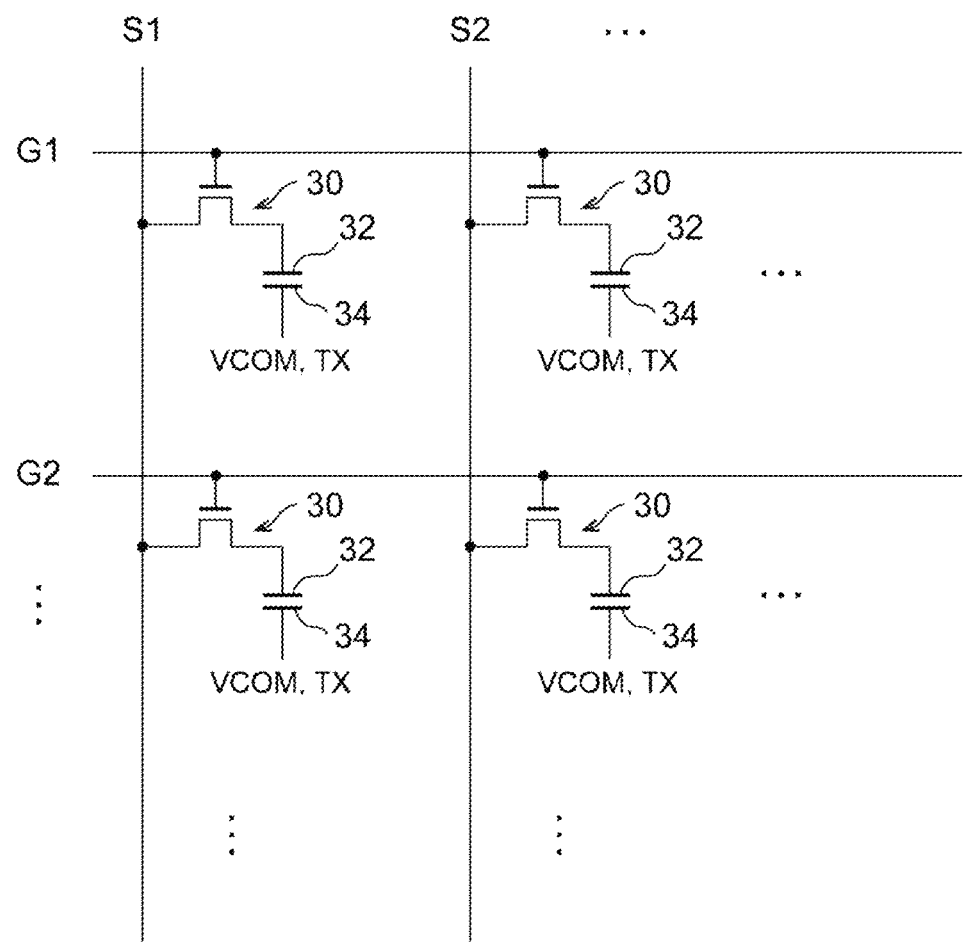
FIG. 2 is a diagram that schematically shows a circuit configuration of a display device shown in FIG. 1.

FIG. 2 schematically shows a circuit configuration of each display device 22 shown in FIG. 1. FIG. 2 also shows schematic arrangement of constituting elements. The display device 22 includes multiple gate lines G1, G2, and the like extending in a row direction, multiple source lines S1, S2, and the like extending in a column direction, multiple pixel switching elements 30, multiple pixel electrodes 32, and multiple common electrodes 34. Each pixel switching element 30 is a thin-film transistor provided near an intersection of a gate line and a source line such as to correspond to a pixel. In each pixel switching element 30, the gate is connected with a gate line, the source is connected with a source line, and the drain is connected with a pixel electrode 32. For one common electrode 34, multiple pixel switching elements 30 and multiple pixel electrodes 32 are arranged. The liquid crystal layer is controlled by means of electric fields between pixel electrodes 32 and common electrodes 34. The common electrodes 34 are used for both image display and touch detection. Accordingly, the number of electrode layers can be reduced, so that the display device 22 can be made thinner.

Figure 3:
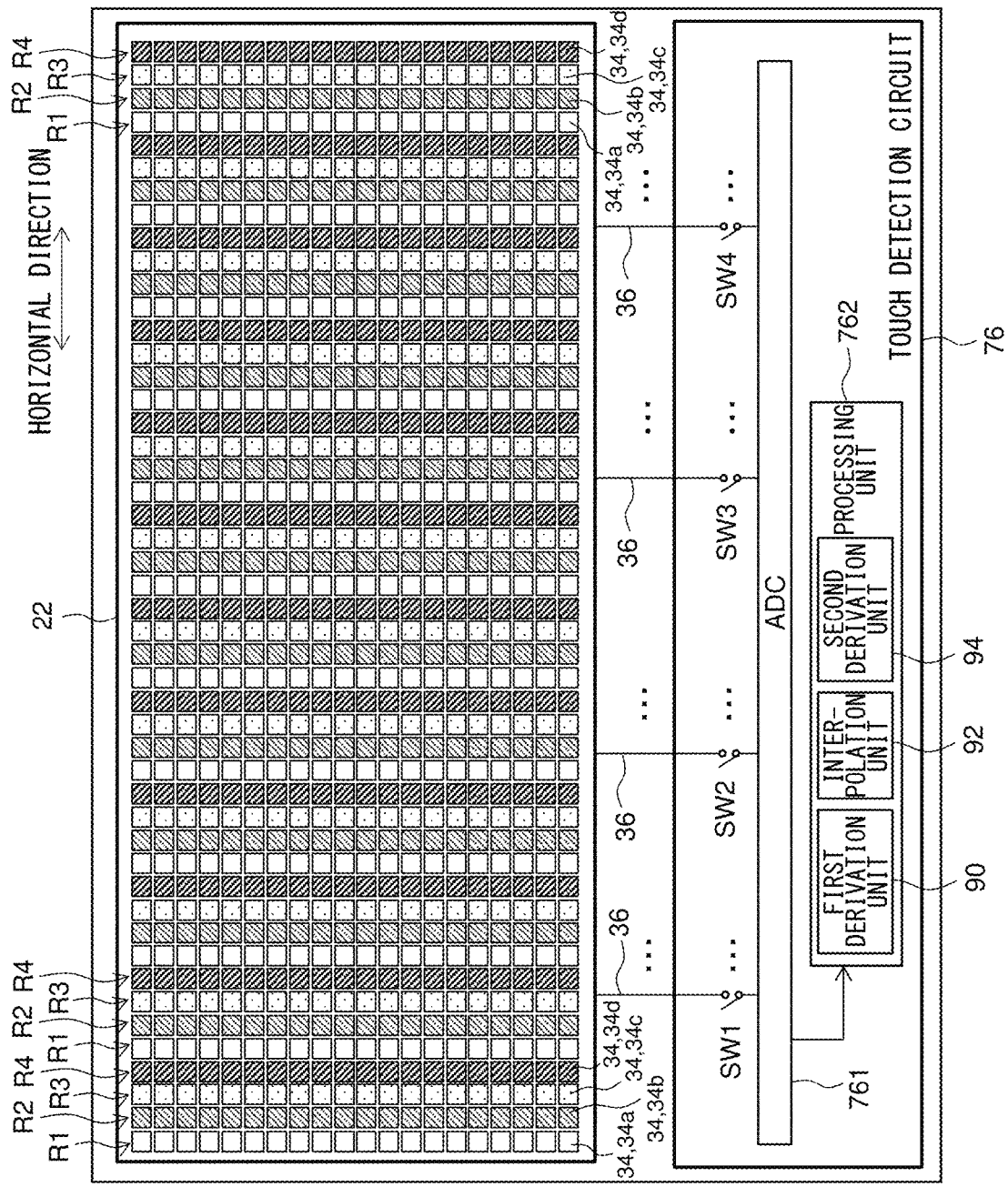
FIG. 3 is a diagram showing the arrangement of common electrodes shown in FIG. 2 and the connection between the display device and a touch detection circuit.

FIG. 3 shows the arrangement of common electrodes 34 shown in FIG. 2 and the connection between the display device 22 and a touch detection circuit 76. FIG. 3 is a diagram of a display surface of the display device 22 as viewed from the viewer's side. The multiple common electrodes 34 are arranged in a matrix. Each common electrode 34 is connected to the control device 24 with a first signal line 36a, a second signal line 36b, a third signal line 36c, or a fourth signal line 36d.

The display device 22 detects a touch position based on the self-capacitance method. When a finger is brought closer to the display surface of the display device 22, capacitance is formed between a common electrode 34 and the finger. The formation of capacitance increases parasitic capacitance in the common electrode 34, so that the current flowing when a touch drive signal is supplied to the common electrode 34 is increased. Based on the current variation, the touch position is detected.

The description now returns to FIG. 1. The control device 24 may be configured as an IC, for example, and controls the display device 22 based on the control data CD and the image data DD from the host 10. The control device 24 includes a control circuit 70, a first drive circuit 72, a second drive circuit 74, and a touch detection circuit 76.

The control circuit 70 may be configured as a microcomputer, for example, and controls signal generation timing of the first drive circuit 72 and the second drive circuit 74, touch detection timing of the touch detection circuit 76, and the like.

The control circuit 70 controls the first drive circuit 72, the second drive circuit 74, and the touch detection circuit 76 such that, during a frame period, one frame of a display image is rendered on the display device 22 and touch detection for one screen is performed at least once. The frame period may also be referred to as a one frame period or a vertical synchronization period. The frame period will be detailed later.

The first drive circuit 72 generates a reference clock signal under the control of the control circuit 70. The first drive circuit 72 also generates, under the control of the control circuit 70, a source signal SS in synchronization with the generated reference clock signal, based on the image data DD from the host 10. The first drive circuit 72 also generates, under the control of the control circuit 70, a gate signal GS in synchronization with the generated reference clock signal.

The first drive circuit 72 supplies the source signal SS serially to multiple source lines in the display device 22, and also supplies the gate signal GS serially to multiple gate lines in the display device 22.

The first drive circuit 72 supplies the reference clock signal to the second drive circuit 74. The second drive circuit 74 generates a reference voltage VCOM, which is a predetermined fixed voltage, and a touch drive signal TX in synchronization with the reference clock signal, under the control of the control circuit 70. The touch drive signal TX may be a square wave signal, or may be a sine wave signal. Through the first signal line 36a, the second signal line 36b, the third signal line 36c, and the fourth signal line 36d shown in FIG. 3, the second drive circuit 74 supplies the reference voltage VCOM or the touch drive signal TX to the multiple common electrodes 34 in the entire display device 22.

The touch detection circuit 76 detects the presence or absence of a touch made by an object on the display device 22. Under the control of the control circuit 70, the touch detection circuit 76 performs detection of a touch made by an object on a position corresponding to a common electrode 34, based on a touch detection signal Rx received from the common electrode 34 when the touch drive signal TX is supplied to each common electrode 34.

The touch detection circuit 76 integrates, for a predetermined period of time from the rising edge of each pulse of the touch drive signal TX, the touch detection signal RX received from each common electrode 34 and derives the difference value between the integral value and a reference value. Instead of or in addition to this processing, the touch detection circuit 76 may integrate, for a predetermined period of time from the falling edge of each pulse of the touch drive signal TX, the touch detection signal RX received from each common electrode 34 and derive the difference value between the integral value and the reference value. For the touch detection signal Rx received from one common electrode 34 during one touch detection period, the number of obtained difference values is proportional to the number of pulses in the touch drive signal TX within one touch detection period. Each value represents the difference value between the capacitance of the common electrode 34 and a reference capacitance. For each common electrode 34, the touch detection circuit 76 calculates the average value of these difference values or the sum of these difference values as a detection value. The detection value also represents the difference value between the capacitance of the common electrode 34 and the reference capacitance. The detection value is also referred to as a delta value. When the capacitance variation in a common electrode 34 due to a touch by an object is larger, the detection value becomes larger. When there is no touch and the capacitance variation in a common electrode 34 is zero, the detection value is also zero.

The touch detection circuit 76 compares a detection value derived based on the touch detection signal Rx received from each common electrode 34 with a predetermined touch detection threshold. When the detection value is greater than or equal to the touch detection threshold, the touch detection circuit 76 judges that there has been a touch to the position of the corresponding common electrode 34. This corresponds to that a touch is detected. Based on the position of the common electrode 34 to which it is judged that there has been a touch, the touch detection circuit 76 detects a touch position within the screen. Based on the detected touch position information, the touch detection circuit 76 derives coordinate data TD of the touch position and outputs the coordinate data TD to the control circuit 70.

The control circuit 70 outputs the coordinate data TD derived from the touch detection circuit 76 to the control device 12 of the host 10. The control device 12 performs various processes based on the coordinate data TD.

The configurations of the control device 12 and the control circuit 70 can be implemented by cooperation between hardware resources and software resources or only by hardware resources. As the hardware resources, analog devices, microcomputers, DSPs, ROMs, RAMs, FPGAs, or other LSIs can be employed. As the software resources, firmware and other programs can be used.

In the following, the control of the display device 22 performed by the control circuit 70 and the operations of the display device 22 will be specifically described. The control circuit 70 alternately repeats partial image display on one of multiple display regions within the screen and partial touch detection on some of multiple touch detection regions within the screen, so as to control the image display and the touch detection in a time division manner.

As shown in FIG. 3, 960 common electrodes 34 having 20 rows and 48 columns are assumed in the present embodiment. The number of common electrodes 34 is not limited to "960" and can be set according to the required characteristics, screen size, and the like. The multiple common electrodes 34 have 240 first common electrodes 34a, 240 second common electrodes 34b, 240 third common electrodes 34c, and 240 fourth common electrodes 34d. For ease of understanding, in FIG. 3, the first common electrodes 34a are not hatched and the second common electrodes 34b, the third common electrodes 34c, and the fourth common electrodes 34d are hatched differently.

Within the same row, a second common electrode 34b is adjacent to a first common electrode 34a, a third common electrode 34c is adjacent to the second common electrode 34b, a fourth common electrode 34d is adjacent to the third common electrode 34c, and a first common electrode 34a is adjacent to the fourth common electrode 34d. One common electrode 34 has a rectangle shape having a length of several mm and a width of several mm in a flat view and, for example, has a substantially square shape having a length of about 5 mm and a width of about 5 mm in the embodiment. Therefore, when an object such as a finger touches near the center of one common electrode 34, the capacitance of at least the two common electrodes 34 on the respective sides also changes to the extent that the touch is detected. In other words, the first common electrode 34a, the second common electrode 34b, and the third common electrode 34c are located within a range where when an object touches the second common electrode 34b, the capacitance of each of the first common electrode 34a, the second common electrode 34b, and the third common electrode 34c changes, allowing for detecting that there has been a touch at each of the electrodes. If one common electrode 34 has, for example, a square shape of about 5 mm in length and about 5 mm in width, when a user tries to touch the first common electrode 34a with a finger, the finger may also touch the second common electrode 34b next to the first common electrode 34a. At this time, if the user's finger touches a position on the second common electrode 34b closer to the third common electrode 34c than the center of the second common electrode 34b, the capacitance of the third common electrode 34c also changes to the extent that the touch is detected. In other words, a touch to the first common electrode 34a may also be detected at the third common electrode 34c. Since the size of a finger is approximately 1 cm, for example, if at least one of the length or width of one common electrode 34 is 5 mm or less, common electrodes 34 that are adjacent to and are in a second column from the common electrode 34 can be also considered to be located within a range that allows for detecting that there has been a touch.

In the same column, 20 first common electrodes 34a, 20 second common electrodes 34b, 20 third common electrodes 34c, or 20 fourth common electrodes 34d are arranged.

The display device 22 includes 12 touch detection regions R1, 12 touch detection regions R2, 12 touch detection regions R3, and 12 touch detection regions R4, where multiple common electrodes 34 in the screen are divided into multiple groups.

Each touch detection region R1 includes 20 first common electrodes 34a in one column. Each touch detection region R2 includes 20 second common electrodes 34b in one column. Each touch detection region R3 includes 20 third common electrodes 34c in one column. Each touch detection region R4 includes 20 fourth common electrodes 34d in one column.

A touch detection region R1, a touch detection region R2, a touch detection region R3, and a touch detection region R4 are horizontally arranged repeatedly in order from the left to the right when viewed from the viewer.

The touch detection circuit 76 has 240 first switches SW1, 240 second switches SW2, 240 third switches SW3, 240 fourth switches SW4, an A/D converter 761, and a processing unit 762. For simplified drawing, a part of the first signal lines 36a and the like, a part of the first switches SW1 and the like, and the connections between the common electrodes 34 and the first signal lines 36a and the like are omitted in FIG. 3.

The processing unit 762 has a first derivation unit 90, an interpolation unit 92, and a second derivation unit 94. The processing unit 762 may be configured as a microcomputer integrated with the control circuit 70. The configuration of the processing unit 762 can be realized by cooperation of hardware resources and software resources, or only by hardware resources. As the hardware resources, analog devices, microcomputers, DSPs, ROMs, RAMs, FPGAs, or other LSIs can be employed. As the software resources, firmware and other programs can be used. For example, the processing unit 762 has a DSP, a ROM, and a RAM, and the DSP develops a program stored in the ROM in the RAM and executes the program, thereby causing the first derivation unit 90, the interpolation unit 92, and the second derivation unit 94 to be realized as functional units.

Figure 4:
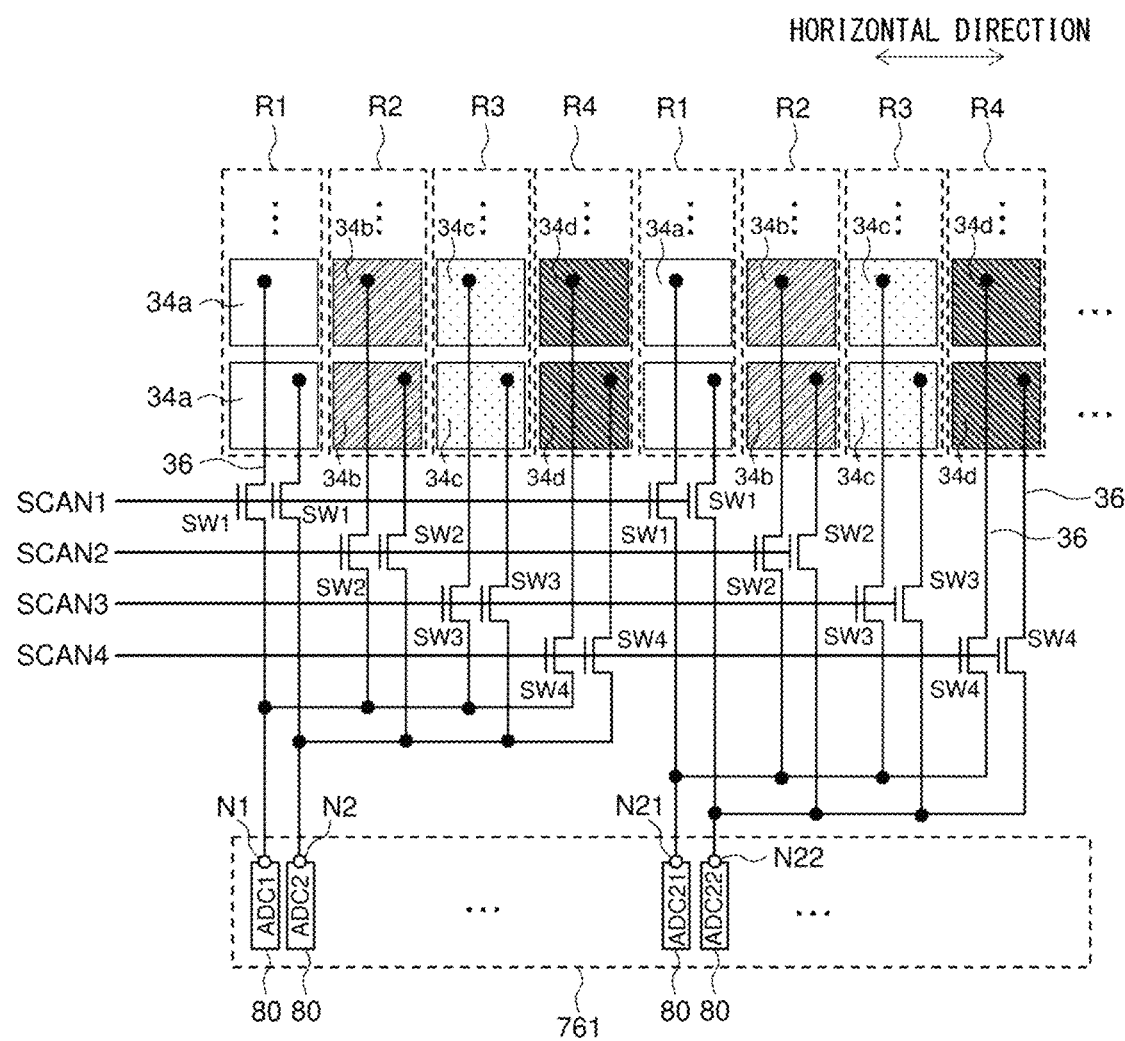
FIG. 4 is a diagram showing the connection of the common electrodes, first switches, etc., and an A/D converter shown in FIG. 3.

FIG. 4 shows the connection of the common electrodes 34, the first switches SW1, etc., and the A/D converter 761 shown in FIG. 3. FIG. 4 shows some of the common electrodes 34, etc. In FIG. 4 and the following description, when the multiple first common electrodes 34a are to be distinguished from one another, the first common electrodes 34a are denoted as a first common electrode 34a_1, a first common electrode 34a_2, and so on. In other words, the m-th first common electrode 34a is denoted as "first common electrode 34a_m" where m is an integer from 1 to 240. In the same manner, the m-th second common electrode 34b is denoted as "second common electrode 34b_m" when the multiple second common electrodes 34b are to be distinguished from one another. The m-th third common electrode 34c is denoted as "third common electrode 34c_m" when the multiple third common electrodes 34c are to be distinguished from one another. The m-th fourth common electrode 34d is denoted as "fourth common electrode 34d_m" when the multiple fourth common electrodes 34d are to be distinguished from one another. Further, in FIG. 4 and the following description, the m-th first signal line 36a is denoted as "first signal line 36a_m" when the multiple first signal lines 36a are to be distinguished from one another. The m-th second signal line 36b is denoted as "second signal line 36b_m" when the multiple second signal lines 36b are to be distinguished from one another. The m-th third signal line 36c is denoted as "third signal line 36c_m" when the multiple third signal lines 36c are to be distinguished from one another. The m-th fourth signal line 36d is denoted as "fourth signal line 36d_m" when the multiple fourth signal lines 36d are to be distinguished from one another. Further, in FIG. 4 and the following description, the m-th first switch SW1 is denoted as "first switch SW1_m" when the multiple first switches SW1 are to be distinguished from one another. The m-th second switch SW2 is denoted as "second switch SW2_m" when the multiple second switches SW2 are to be distinguished from one another. The m-th third switch SW3 is denoted as "third switch SW3_$m$" when the multiple third switches SW3 are to be distinguished from one another. The m-th fourth switch SW4 is denoted as "fourth switch SW4_$m$" when the multiple fourth switches SW4 are to be distinguished from one another.

The A/D converter 761 has 240 A/D conversion circuits 80_1, 80_2, 80_21, 80_22, and so on. The m-th A/D conversion circuit 80 is denoted as "A/D conversion circuit 80_$m$." Hereinafter, if these A/D conversion circuits are not to be distinguished, the A/D conversion circuits are referred to as "A/D conversion circuits 80." Since the number of A/D conversion circuits 80 is less than the number of common electrodes 34 within the screen, the common electrodes 34 connected to the A/D conversion circuits 80 are switched by means of the first switches SW1, the second switches SW2, the third switches SW3, and the fourth switches SW4. The number of the A/D conversion circuits 80 is equal to the number of input signals that can be simultaneously processed at the A/D converter 761, and may also be referred to as the number of input channels.

Each A/D conversion circuit 80 performs A/D conversion on a signal supplied to the input node, and supplies the A/D converted digital signal to the processing unit 762. The A/D conversion circuit 80_1 indicated as "ADC1" in FIG. 4 performs A/D conversion on signals supplied to an input node N1. The A/D conversion circuit 80_2 indicated as "ADC2" performs A/D conversion on signals supplied to an input node N2. The A/D conversion circuit 80_21 indicated as "ADC21" performs A/D conversion on signals supplied to an input node N21. The A/D conversion circuit 80_22 indicated as "ADC22" performs A/D conversion on signals supplied to an input node N22. The other A/D conversion circuits 80, whose illustrations are omitted, also operate in the same manner. The m-th input node is hereinafter denoted as "input node Nm." The processing unit 762 detects a touch as previously described based on a supplied digital signal.

The 240 first common electrodes 34$a$ and the 240 first switches SW1 correspond to each other in a one-to-one manner. The 240 first switches SW1 and the 240 A/D conversion circuits 80 correspond to each other in a one-to-one manner. Each of the 240 first switches SW1 is connected between the first signal line 36$a$ connected to the corresponding first common electrode 34$a$ and the corresponding input node, and switches between conduction and non-conduction between the corresponding first common electrode 34$a$ and the corresponding input node based on a control signal SCAN1. In other words, the first switch SW1_$m$ is connected between the first signal line 36$a$_m and the input node Nm, and switches between conduction and non-conduction between the first common electrode 34$a$_m and the input node Nm.

The 240 second common electrodes 34$b$ and the 240 second switches SW2 correspond to each other in a one-to-one manner. The 240 second switches SW2 and the 240 A/D conversion circuits 80 correspond to each other one-to-one. Each of the 240 second switches SW2 is connected between the second signal line 36$b$ connected to the corresponding second common electrode 34$b$ and the corresponding input node, and switches between conduction and non-conduction between the corresponding second common electrode 34$b$ and the corresponding input node based on a control signal SCAN2. In other words, the second switch SW2_$m$ is connected between the second signal line 36$b$_m and the input node Nm, and switches between conduction and non-conduction between the second common electrode 34$b$_m and the input node Nm.

The 240 third common electrodes 34$c$ and the 240 third switches SW3 correspond to each other in a one-to-one manner. The 240 third switches SW3 and the 240 A/D conversion circuits 80 correspond to each other one-to-one. Each of the 240 third switches SW3 is connected between the third signal line 36$c$ connected to the corresponding third common electrode 34$c$ and the corresponding input node, and switches between conduction and non-conduction between the corresponding third common electrode 34$c$ and the corresponding input node based on a control signal SCAN3. In other words, the third switch SW3_$m$ is connected between the third signal line 36$c$_m and the input node Nm, and switches between conduction and non-conduction between the third common electrode 34$c$_m and the input node Nm.

The 240 fourth common electrodes 34$d$ and the 240 fourth switches SW4 correspond to each other in a one-to-one manner. The 240 fourth switches SW4 and the 240 A/D conversion circuits 80 correspond to each other one-to-one. Each of the 240 fourth switches SW4 is connected between the fourth signal line 36$d$ connected to the corresponding fourth common electrode 34$d$ and the corresponding input node, and switches between conduction and non-conduction between the corresponding fourth common electrode 34$d$ and the corresponding input node based on a control signal SCAN4. In other words, the fourth switch SW4_$m$ is connected between the fourth signal line 36$d$_m and the input node Nm, and switches between conduction and non-conduction between the fourth common electrode 34$d$_m and the input node Nm.

A first switch SW1, a second switch SW2, a third switch SW3, and a fourth switch SW4 are commonly connected to the input node of one A/D conversion circuit 80.

The control device 24 is further provided with a first control signal line 101, a second control signal line 102, a third control signal line 103, and a fourth control signal line 104. The first control signal line 101 is connected to the control terminals of multiple first switches SW1 and switches on and off of the multiple first switches SW1. A control signal SCAN1 is supplied to the first control signal line 101 from the control circuit 70. The second control signal line 102 is connected to the control terminals of multiple second switches SW2 and switches on and off of the multiple second switches SW2. A control signal SCAN2 is supplied to the second control signal line 102 from the control circuit 70. The third control signal line 103 is connected to the control terminals of multiple third switches SW3 and switches on and off of the multiple third switches SW3. A control signal SCAN3 is supplied to the third control signal line 103 from the control circuit 70. The fourth control signal line 104 is connected to the control terminals of multiple fourth switches SW4 and switches on and off of the multiple fourth switches SW4. A control signal SCAN4 is supplied to the fourth control signal line 104 from the control circuit 70.

The 240 first switches SW1 are controlled based on a common control signal SCAN1. Conductivity is established between each of the 240 first common electrodes 34$a$ and the corresponding input node of the 240 A/D conversion circuits 80 when the 240 first switches SW1 become conductive.

The 240 second switches SW2 are controlled based on a common control signal SCAN2. Conductivity is established between each of the 240 second common electrodes 34$b$ and the corresponding input node of the 240 A/D conversion circuits 80 when the 240 second switches SW2 become conductive.

The 240 third switches SW3 are controlled based on a common control signal SCAN3. Conductivity is established between each of the 240 third common electrodes 34c and the corresponding input node of the 240 A/D conversion circuits 80 when the 240 third switches SW3 become conductive.

The 240 fourth switches SW4 are controlled based on a common control signal SCAN4. Conductivity is established between each of the 240 fourth common electrodes 34a and the corresponding input node of the 240 A/D conversion circuits 80 when the 240 fourth switches SW4 become conductive.

The control circuit 70 operates the touch detection circuit 76 in the second mode until a touch is detected, and operates the touch detection circuit 76 in the first mode when a touch is detected. The first mode can also be referred to as a normal scan mode and the second mode can also be referred to as a response priority scan mode.

Figure 5:
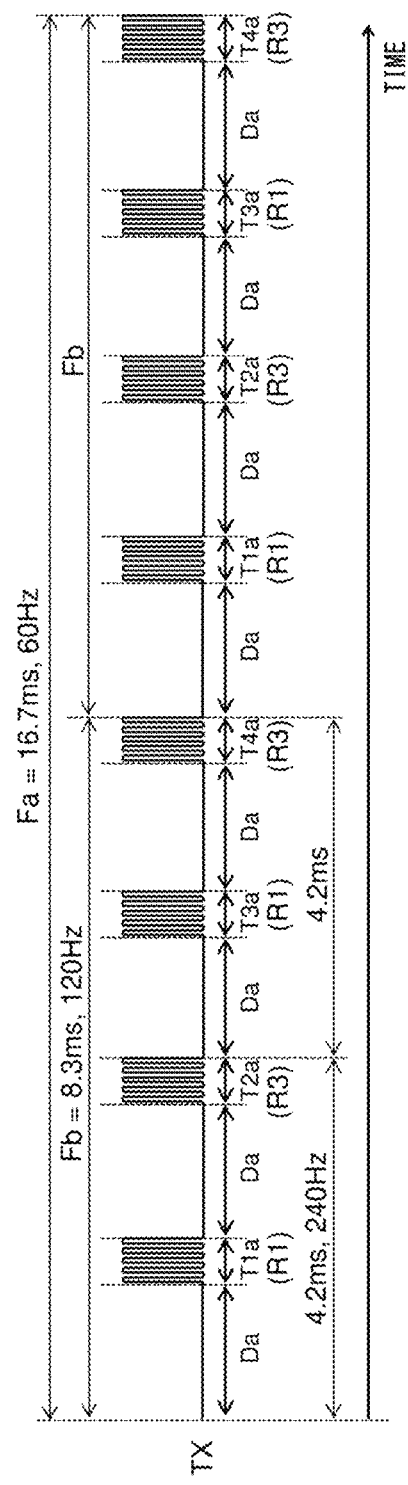
FIG. 5 is a diagram showing times and waveforms of a touch drive signal within a frame period in a second mode in the display system shown in FIG. 1.

First, an explanation will be given of the operation in the second mode. FIG. 5 shows times and waveforms of a touch drive signal TX within a frame period Fa in the second mode in the display system shown 1 in FIG. 1.

An example shown in FIG. 5 is an example in which one image is displayed, touch detection in a touch detection region R1 is performed four times, and touch detection in a touch detection region R3 is performed four times in a frame period Fa. Touch detection in a touch detection region R2 and touch detection in a touch detection region R4 are not performed.

In the present embodiment, the display device 22 is assumed to be a display device driven at 60 Hz to display an image, and the frame period Fa is therefore set to about 16.7 ms. The touch detection in the touch detection region R1 and the touch detection in the touch detection region R3 are performed four times within a frame period Fa and are therefore performed at a cycle of about 4.2 ms.

A frame period Fa is divided into two sub-frame periods Fb. Each sub-frame period Fb includes four display periods Da and four touch detection periods T1a, T2a, T3a, and T4a. The display periods Da and the touch detection periods are alternately arranged. In each sub-frame period Fb, a display period Da, a touch detection period T1a, a display period Da, a touch detection period T2a, a display period Da, a touch detection period T3a, a display period Da, and a touch detection period T4a are arranged in this order. The number of display periods Da and the number of touch detection periods in a frame period Fa are not limited to "eight."

The display device 22 displays one-eighth of a frame for each display period Da. Accordingly, one frame is displayed in the eight display periods Da within a frame period Fa. More specifically, during a display period Da, the first drive circuit 72 supplies the source signal SS to the multiple source lines and also supplies the gate signal GS to corresponding gate lines, and the second drive circuit 74 supplies the reference voltage VCOM to the multiple common electrodes 34. The second drive circuit 74 stops supply of the touch drive signal TX during the display periods Da.

During each touch detection period, the second drive circuit 74 supplies a touch drive signal TX to the multiple common electrodes 34 in the touch detection regions R1 through R4. The second drive circuit 74 stops supply of the reference voltage VCOM during the touch detection periods.

When no touch has been detected, the control circuit 70 makes different multiple first switches SW1 or multiple third switches SW3 conductive for each touch detection period. The touch detection signals RX that are input to the switches made conductive are output to the A/D converter 761. The A/D converter 761 converts the analog touch detection signals RX input via the switches, into digital touch detection signals.

During the touch detection period T1a, the touch detection circuit 76 performs detection of a touch made by an object to each of the touch detection regions R1, based on touch detection signals RX received respectively from the multiple first common electrodes 34a in the 20 touch detection regions R1. During the touch detection period T2a, the touch detection circuit 76 performs detection of a touch made by an object to each of the touch detection regions R3, based on touch detection signals RX received respectively from the multiple third common electrodes 34c in the 20 touch detection regions R3.

During the touch detection period T3a, the touch detection circuit 76 performs detection of a touch made by an object to each of the touch detection regions R1, based on touch detection signals RX received respectively from the multiple first common electrodes 34a in the 20 touch detection regions R1. During the touch detection period T4a, the touch detection circuit 76 performs detection of a touch made by an object to each of the touch detection regions R3, based on touch detection signals RX received respectively from the multiple third common electrodes 34c in the 20 touch detection regions R3.

Thus, when no touch has been detected, during each of the multiple touch detection periods, the touch detection circuit 76 removes some touch detection regions and performs touch detection in a touch detection region different for each touch detection period. The touch detection circuit 76 serially changes a touch detection region serving as a detection target from among the touch detection regions R1 and the touch detection regions R3. The touch detection circuit 76 does not detect touches at the second common electrodes 34b in the touch detection regions R2 and the fourth common electrodes 34d in the touch detection regions R4 in any touch detection period in a single frame period Fa. Touch detection in a touch detection region R1 is performed four times, and touch detection in a touch detection region R3 is performed four times during eight touch detection periods in a frame period Fa.

Figure 6:
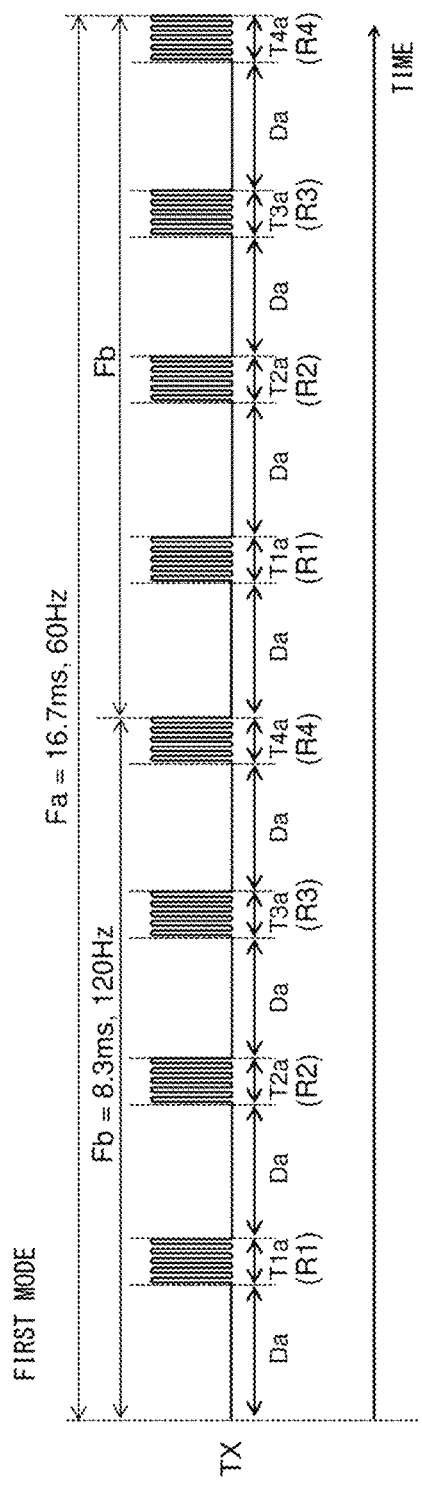
FIG. 6 is a diagram showing times and waveforms of a touch drive signal within a frame period in a first mode in the display system shown in FIG. 1.

Next, the operation in the first mode when a touch is detected will be explained, mainly on the differences from the second mode. FIG. 6 shows times and waveforms of a touch drive signal TX within a frame period Fa in the second mode in the display system shown 1 in FIG. 1.

In the example shown in FIG. 6, one image is displayed and touch detection for one screen is performed twice within a frame period Fa. Since the touch detection for one screen is performed twice within a frame period Fa, the touch detection is performed at a cycle of about 8.3 ms.

The control circuit 70 makes different multiple first switches SW1, multiple second switches SW2, multiple third switches SW3, or multiple fourth switches SW4 conductive for each touch detection period.

During the touch detection period T1a, the touch detection circuit 76 performs detection of a touch made by an object to each of the touch detection regions R1, based on touch detection signals RX received respectively from the multiple first common electrodes 34a in the 20 touch detection regions R1. During the touch detection period T2a, the touch detection circuit 76 performs detection of a touch made by an object to each of the touch detection regions R2, based on touch detection signals RX received respectively from the multiple second common electrodes 34b in the 20 touch detection regions R2.

During the touch detection period T3a, the touch detection circuit 76 performs detection of a touch made by an object to each of the touch detection regions R3, based on touch detection signals RX received respectively from the multiple third common electrodes 34c in the 20 touch detection regions R3. During the touch detection period T4a, the touch detection circuit 76 performs detection of a touch made by an object to each of the touch detection regions R4, based on touch detection signals RX received respectively from the multiple fourth common electrodes 34d in the 20 touch detection regions R4.

Thus, during each of the multiple touch detection periods, the touch detection circuit 76 performs touch detection in a touch detection region different for each touch detection period in the first mode. In other words, the touch detection circuit 76 serially changes the touch detection region as a detection target. During the eight touch detection periods in a frame period Fa, touch detection for one screen is performed twice.

In the first mode, since touches are detected in all touch detection regions, the touch position detection accuracy can be improved more compared to the second mode. On the other hand, the second mode can detect the touch position faster than the first mode.

In the touch detection circuit 76, the operation returns to the operation in the second mode when a touch can no longer be detected in the first mode.

Figure 7:
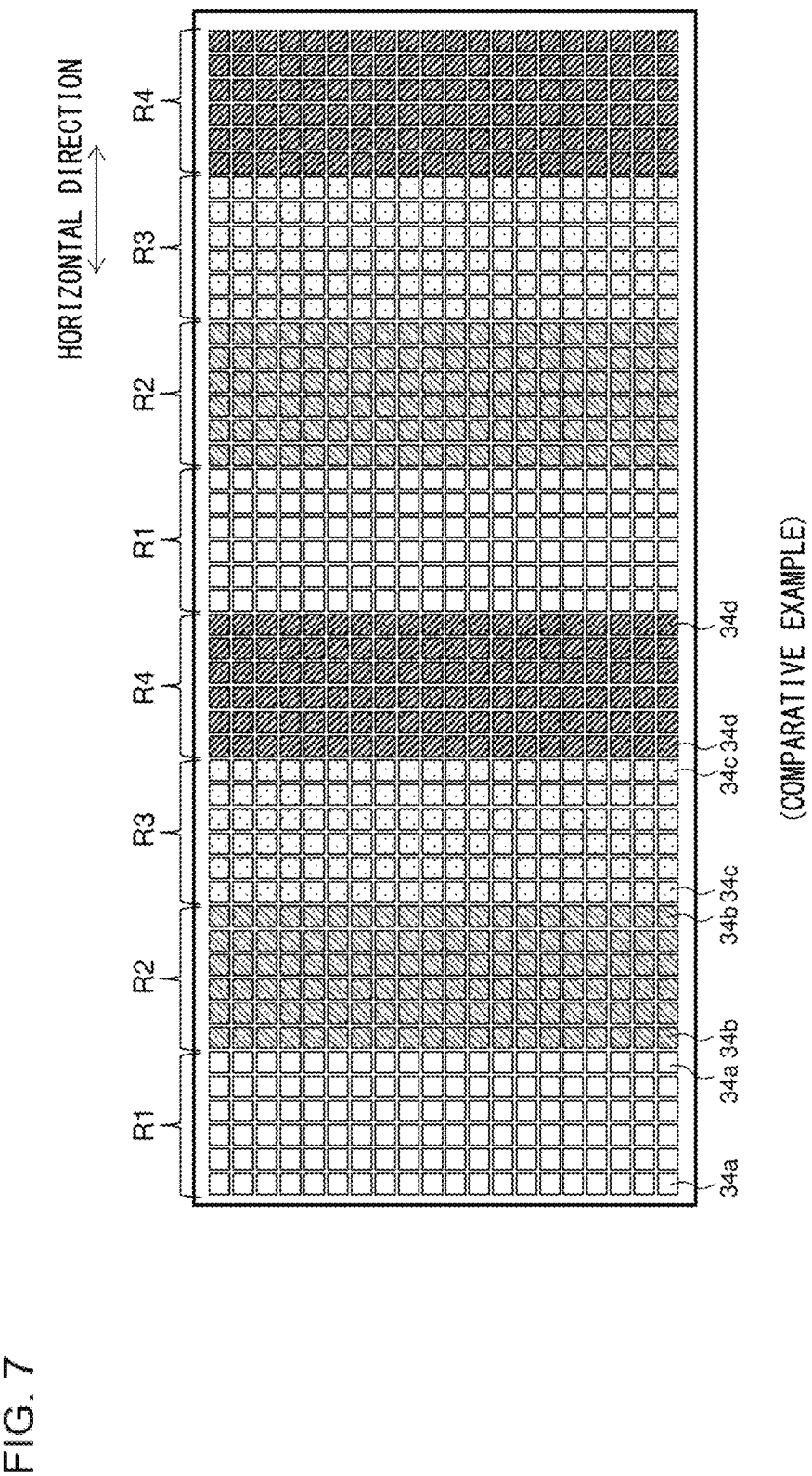
FIG. 7 is a diagram showing a touch detection region of a display device in a comparative example.

A comparative example will now be described. FIG. 7 shows a touch detection region of a display device in a comparative example. In the comparative example, the display device includes two touch detection regions R1, two touch detection regions R2, two touch detection regions R3, and two touch detection regions R4. The number of common electrodes included in each touch detection region is 120 in 20 rows by six columns and is more than that in the embodiment.

In the comparative example, touches are detected in a different touch detection region for each touch detection period. Times at which image display is performed and times at which touch detection is performed are the same as those in FIG. 6. Touches are detected in the two touch detection regions R1 in the touch detection period T1a. Touches are detected in the two touch detection regions R2 in the next touch detection period T2a. Touches are detected in the two touch detection regions R3 in the following touch detection period T3a. Then, touches are detected in the two touch detection regions R4 in the following touch detection period T4a.

In the comparative example, touch detection in a touch detection region is performed every 8.3 ms as a sub-frame period Fb. For example, a case is considered where a common electrode located in the leftmost column in a touch detection region R1 is touched immediately after the touch detection period T1a. This touch is detected in a touch detection period T1a of the next subframe period Fb, and the coordinates are calculated within about 5 ms after the end of the subframe period. Therefore, the first touch response is approximately as follows: 8.3+8.3+5=21.6 ms.

In contrast to this comparative example, in the present embodiment, the touch detection response can be made faster than that in the comparative example. In the second mode in FIG. 5, touch detection in the touch detection regions R1 is performed with a period of about 4.2 ms, that is, 240 Hz. For example, a case is considered where a common electrode located in the leftmost column in a touch detection region R1 is touched immediately after the touch detection period T1a as in the case of the comparative example. This touch is detected in the following touch detection period T3a, and the coordinates are calculated within about 5 ms after the end of the subframe period Fb. Therefore, the first touch response is approximately as follows: 4.2+4.2+5=13.3 ms, and a touch made to the screen by an object can be detected earlier compared to the comparative example.

Further, for example, a case is considered where a common electrode located in the second column from the left is touched immediately after the touch detection period T1a. This common electrode is included in the touch detection region R1 in the comparative example and in the touch detection region R2 in the present embodiment. In the comparative example, this touch is detected in the touch detection period T1a of the next subframe period Fb, and the coordinates are calculated after the end of the subframe period Fb. On the other hand, in the present embodiment, this touch is detected by a change in the capacitance of the third common electrode 34c of the touch detection region R3 in the next touch detection period T2a in the same subframe period Fb, and the coordinates are calculated after the end of the touch detection period T2a. Therefore, the touch detection response can be made faster in this case as well. The third common electrode 34c in the touch detection region R3 is located next to the second common electrode 34b in the touch detection region R2. In other words, the third common electrode 34c in the touch detection region R3 is located within a range that allows for detecting that there has been a touch in the touch detection region R2. Therefore, even when the touch detection circuit 76 does not perform touch detection in the touch detection region R2, it is possible to detect that there has been a touch in the touch detection region R2 by performing touch detection in the touch detection region R3.

Due to the influence of noise and the like, there is a possibility that a touch is falsely detected even when there is no touch made by an object. To cope with this, the touch detection circuit 76 can also output touch position information only when a touch is detected twice at the same position in the two touch detection periods. In this case, even if a touch is detected only once due to noise or the like, the touch position information is not output, and false detection can therefore be suppressed. The first touch response is considered in a case where the touch detection circuit 76 outputs information on the touch position when two consecutive touches are detected. In the comparative example, for example, when a common electrode in the leftmost column in the touch detection region R1 is touched immediately after the touch detection period T1a, the first touch response is approximately as follows: 8.3+8.3×2+5=29.9 ms.

On the other hand, in the embodiment, for example, when the touch detection region R1 located in the leftmost column as in the comparative example is touched immediately after the touch detection period T1a, the first touch response is approximately as follows: 4.2+4.2×2+5=17.5 ms. Therefore, in this case as well, detection can be made earlier compared to the comparative example.

In the second mode, when touching directly above the second common electrode 34b or the fourth common electrode 34d that has not detected touch, the capacitance of common electrodes 34 on the respective sides of the touched second common electrode 34b or the fourth common electrode 34d changes even if the object is slightly smaller than the size of one side of the common electrode 34. Therefore, it is possible to detect that there has been a touch. However, since a detection value for the second common electrode 34b or the fourth common electrode 34d that has not detected a touch is not derived, an error may occur in the coordinates of the touch position. Therefore, in the second mode, interpolation processing may be performed for interpolating a detection value for a common electrode 34 that has not detected a touch. By performing the interpolation processing, the detection accuracy of the touch position can be improved. It is not essential to perform the interpolation processing in the second mode.

Figures 8, 9:
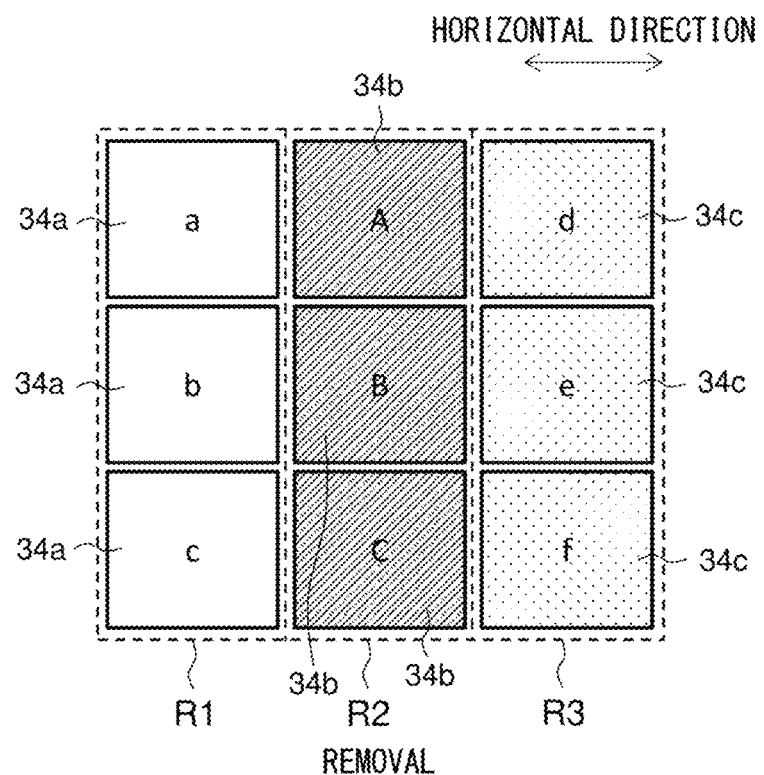
FIG. 8 is a diagram for explaining interpolation processing in the second mode performed in the display system shown in FIG. 1.
FIG. 9 is a diagram showing detection values in the first mode.

FIG. 8 is a diagram for explaining interpolation processing in the second mode performed in the display system 1 shown in FIG. 1. FIG. 8 shows three first common electrodes 34a in the touch detection region R1 in which touch detection has been performed, three second common electrodes 34b in the touch detection region R2 in which touch detection has not been performed, and three third common electrodes 34c in the touch detection region R3 in which touch detection has been performed.

The respective first detection values of the three first common electrodes 34a are expressed as a first detection value a, a first detection value b, and a first detection value c in order from the top. The respective second detection values of the three second common electrodes 34b are expressed as a second detection value A, a second detection value B, and a second detection value C in order from the top. The respective third detection values of the three third common electrodes 34c are expressed as a third detection value d, a third detection value e, and a third detection value f in order from the top.

First, an explanation will be given regarding the first interpolation processing. The first derivation unit 90 derives a first detection value representing a difference value between the capacitance of the first common electrode 34a and the reference capacitance based on the touch detection signal RX received from the first common electrode 34a.

The first derivation unit 90 derives a third detection value representing a difference value between the capacitance of the third common electrode 34c and the reference capacitance based on the touch detection signal RX received from the third common electrode 34c.

The first derivation unit 90 does not derive a second detection value for the second common electrode 34b when touch detection has not been performed at the second common electrode 34b.

The first derivation unit 90 does not derive a fourth detection value for the fourth common electrode 34d when touch detection has not been performed at the fourth common electrode 34d.

When touch detection has not been performed at the second common electrode 34b, the interpolation unit 92 interpolates the second detection value for the second common electrode 34b based on the first detection value and the third detection value of the first common electrode 34a and the third common electrode 34c on the respective sides of the second common electrode 34b for each row. The interpolation unit 92 uses the average value of the first detection value and the third detection value of the first common electrode 34a and the third common electrode 34c on the respective sides of the second common electrode 34b as the second detection value for each row.

Therefore, it is established as follows: the second detection value $A=(a+d)/2$; the second detection value $B=(b+e)/2$; and the second detection value $C=(c+f)/2$.

When touch detection has not been performed at the fourth common electrode 34d, the interpolation unit 92 interpolates the fourth detection value for the fourth common electrode 34d based on the first detection value and the third detection value of the first common electrode 34a and the third common electrode 34c on the respective sides of the fourth common electrode 34d for each row. The interpolation unit 92 uses the average value of the first detection value and the third detection value of the first common electrode 34a and the third common electrode 34c on the respective sides of the fourth common electrode 34d as the fourth detection value for each row.

The second derivation unit 94 derives the touch position based on a first detection value, a second detection value, a third detection value, and a fourth detection value in each row.

The second derivation unit 94 derives a quadratic function that approximates multiple detection values for a row containing the largest detection value, and sets a coordinate corresponding to the vertex of the quadratic function as the x-coordinate of the touch position.

The second derivation unit 94 derives a quadratic function that approximates multiple detection values for a column containing the largest detection value, and sets a coordinate corresponding to the vertex of the quadratic function as the y-coordinate of the touch position. The multiple detection values may be, for example, five detection values.

For example, in an experiment in which the center of a circular conductor with a diameter of 9 mm was aligned with the center of the second common electrode 34b in the center of FIG. 8 and touched, the following values were derived in the second mode: $a=119$; $b=256$; $c=98$; $A=0$; $B=0$; $C=0$; $d=112$; $e=249$; and $f=100$. When it is assumed that detection values are not interpolated, for the row containing the largest detection value, the coordinates corresponding to the vertex of a quadratic curve that approximate five detection values including $b=256$, $B=0$, and $e=249$ are likely to be positioned outside the second common electrode 34b corresponding to B.

The following are established when the interpolation processing is executed: the second detection value $A=(119+112)/2=116$; the second detection value $B=(256+249)/2=253$; and the second detection value $C=(98+100)/2=99$. For the row containing the largest detection value, the coordinates corresponding to the vertex of a quadratic curve that approximate five detection values including $b=256$, $B=253$, and $e=249$ are positioned inside the second common electrode 34b corresponding to B. Therefore, with the relatively simple processing, the detection accuracy of the touch position in the second mode can be improved.

Further, second interpolation processing as described below may be employed. When touch detection has not been performed at the second common electrode 34b, if either one of the first detection value and the third detection value of the first common electrode 34a and the third common electrode 34c on the respective sides of the second common electrode 34b in the same row is less than or equal to a predetermined threshold, the interpolation unit 92 uses the average value of the first detection value and the third detection value as the second detection value.

On the other hand, if both the first detection value and the third detection value of the first common electrode 34a and the third common electrode 34c on the respective sides of the second common electrode 34b in the same row are larger than the threshold, the interpolation unit 92 uses the result of multiplying the average value of the first detection value and the third detection value by a predetermined coefficient as the second detection value. The threshold is, for example, 10. Alternatively, the threshold can be defined according to the maximum value of the detection value and the like. The coefficient may be greater than one, for example, 1.5. The threshold and the coefficient can be appropriately determined through experiments and simulations.

When touch detection has not been performed at the fourth common electrode 34*d*, the interpolation unit 92 interpolates the fourth detection value in the same processing as that used when touch detection has not been performed at the second common electrode 34*b*.

FIGS. 9, 10, and 11 are diagrams for explaining the experimental results of the interpolation processing. These figures show the distribution of detection values obtained when a circular conductor having a diameter of about 4.5 mm is touched in the vicinity between the adjacent four common electrodes: a third common electrode 34*c*; a third common electrode 34*c*; a fourth common electrode 34*d*; and a fourth common electrode 34*d*. The circle in the figure indicates the position of the conductor. FIG. 9 shows a detection value in the first mode, FIG. 10 shows a detection value in the first interpolation processing in the second mode, and FIG. 11 shows a detection value in the second interpolation processing in the second mode.

In FIG. 10, the average value of the detection values on the respective sides is interpolated as the detection value of each of the second common electrode 34*b* and the fourth common electrode 34*d*.

In FIG. 11, the average value of the detection values on the respective sides is interpolated as the detection value of the second common electrode 34*b*, and the detection value of the fourth common electrode 34*d* is interpolated by a value of 1.5 times the average value of the detection values on the respective sides. In this manner, according to the second interpolation processing, it becomes easier to produce a peak of the detection value near the touch position.

The x coordinate obtained from the result shown in FIG. 9 was "945," and the y coordinate was "554." The x coordinate obtained from the result shown in FIG. 10 was "934," and the y coordinate was "554." The x coordinate obtained from the result shown in FIG. 11 was "938," and the y coordinate was "554." Therefore, the second interpolation processing can improve the detection accuracy of the touch position, especially when touching occurs between the four common electrodes 34.

Figure 12:
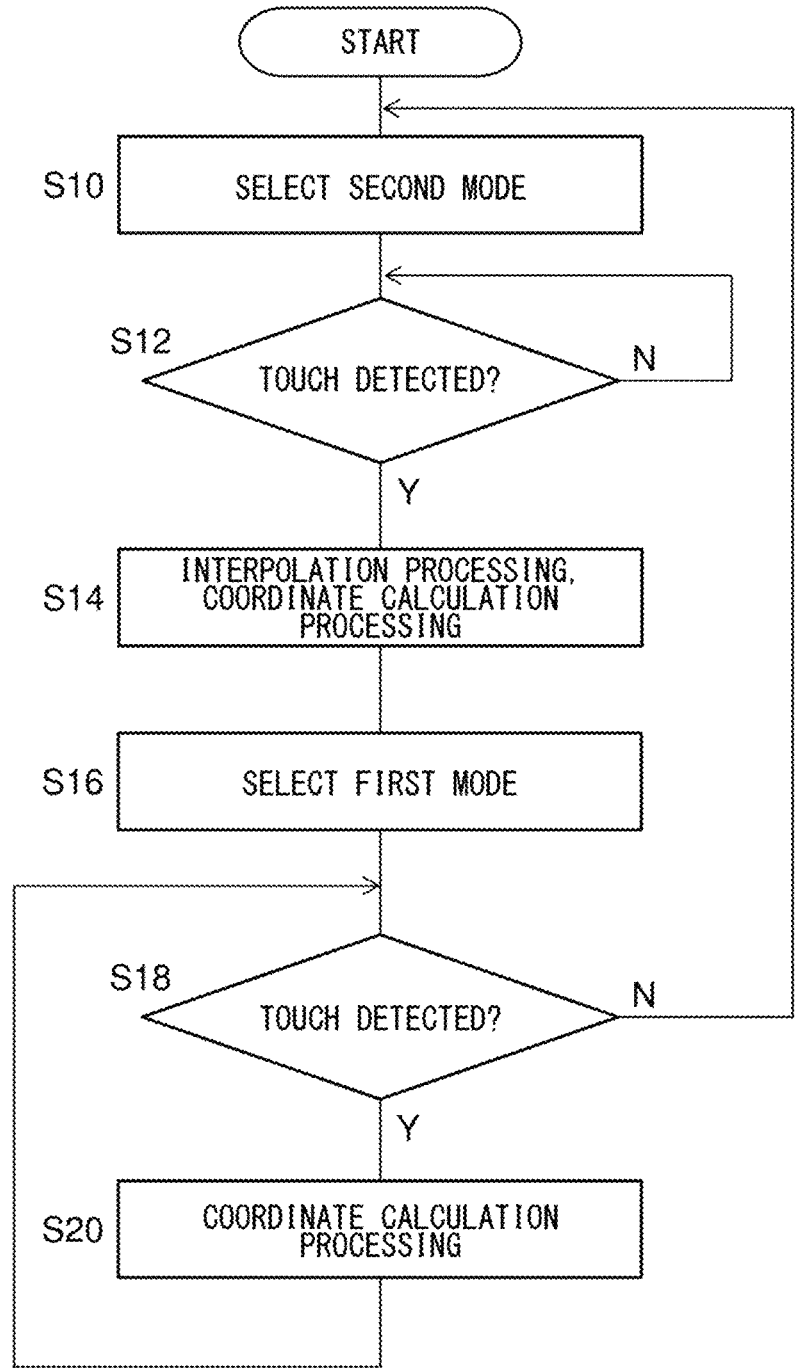
FIG. 12 is a flowchart showing touch detection processing performed in the display system shown in FIG. 1.

There will now be described the overall operation of the display system 1 having the configuration set forth above. FIG. 12 is a flowchart that shows touch detection processing performed in the display system 1 shown in FIG. 1. The control circuit 70 selects the second mode (S10), and the process returns to S12 when no touch has been detected (N in S12). When a touch is detected (Y of S12), the touch detection circuit 76 executes interpolation processing and coordinate calculation processing (S14) and outputs the coordinates, and the control circuit 70 selects the first mode (S16). When a touch is detected (Y in S18), the touch detection circuit 76 executes coordinate calculation processing (S20) and outputs the coordinates, and the process returns to S18. When no touch has been detected in S18 (N in S18), the process returns to S10.

According to the present embodiment, in the second mode, since touch detection is not performed in the touch detection region R2 and the touch detection region R4, the time during which touch detection is performed in the screen region of the display device 22 can be shortened. Therefore, the response to touch detection can be made faster than that in the comparative example. Further, the number of touch detections in the touch detection region R1 and the number of touch detections in the touch detection region R3 in the frame period Fa can be increased from those in the comparative example. When a touch is detected in the second mode, the mode is switched to the first mode, and touch detection is performed in all touch detection regions; therefore, the touch position detection accuracy can be improved compared to the second mode. In addition, examples in which touch detection is performed in the touch detection region R1 and the touch detection region R3 and touch detection is not performed in the touch detection region R2 and the touch detection region R4 have been described; however, these examples are non-limiting. For example, touch detection may be performed in the touch detection region R2 and the touch detection region R4, and touch detection does not need to be performed in the touch detection region R1 and the touch detection region R3.

First Exemplary Variation in First Embodiment

In the first embodiment, the mode is automatically switched from the second mode to the first mode when a touch is detected; however, the mode does not need to be switched even when a touch is detected. In this exemplary variation, the user can select a setting for fixing the mode to the first mode or the second mode.

Figure 13:
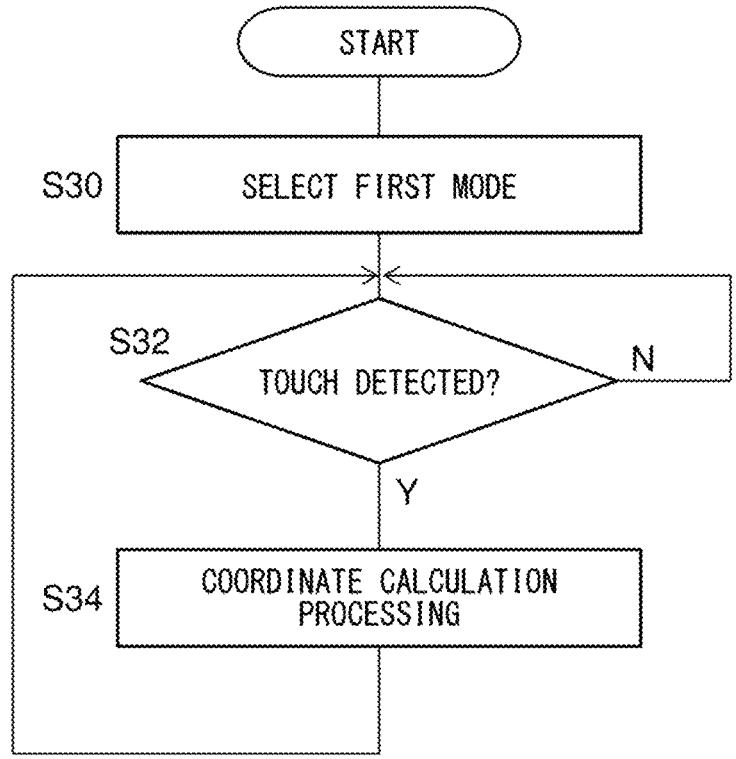
FIG. 13 is a flowchart showing touch detection processing in the first mode performed in a display system according to the first exemplary variation in the first embodiment.

FIG. 13 is a flowchart showing touch detection processing in the first mode performed in a display system 1 according to the first exemplary variation in the first embodiment. This processing is executed when the user sets the mode to be fixed to the first mode. The control circuit 70 selects the first mode (S30), and the process returns to S32 when no touch has been detected (N in S32). When a touch is detected (Y in S32), the touch detection circuit 76 executes coordinate calculation processing (S34) and outputs the coordinates, and the process returns to S32.

In the first mode, each touch detection region is set for a column of common electrodes 34 and is evenly arranged in the screen. For example, a case is considered where the common electrode 34 in the third column from the left is touched immediately after the touch detection period T1*a*. In the comparative example, the common electrode 34 in the third column from the left is included in the touch detection region R1. Therefore, this touch is detected in the touch detection period T1*a* of the next subframe period Fb. On the other hand, the common electrode 34 in the third column from the left is included in the touch detection region R3 in the first exemplary variation. Therefore, this touch is detected in the next touch detection period T2*a* or touch detection period T3*a* in the same subframe period Fb. Therefore, depending on the position and timing of the touch, the response to touch detection can be made faster compared to the comparison example even in the first mode.

Figure 14:
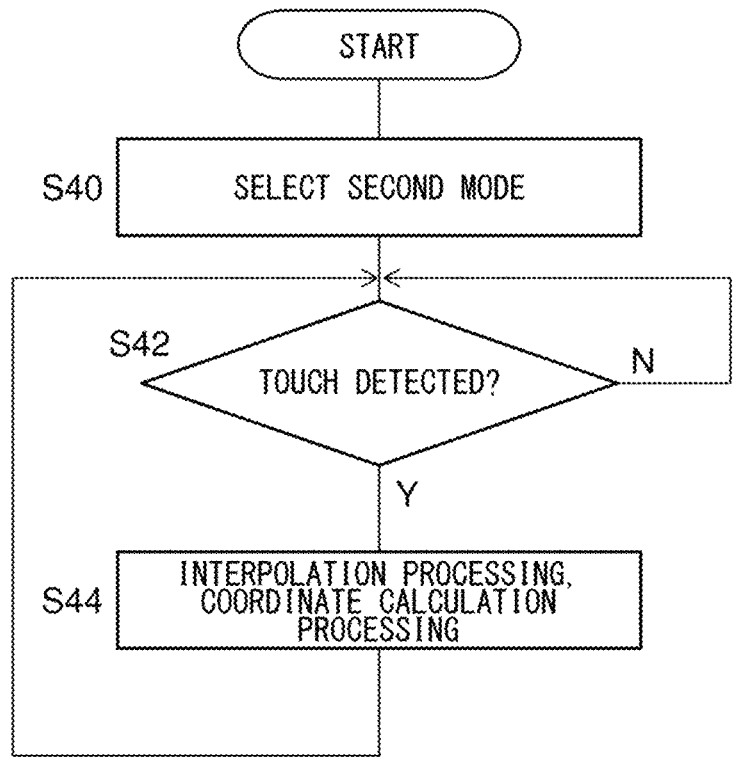
FIG. 14 is a flowchart showing touch detection processing in the second mode performed in the display system according to the first exemplary variation in the first embodiment.

FIG. 14 is a flowchart showing touch detection processing in the second mode performed in the display system 1 according to the first exemplary variation in the first embodiment. This processing is executed when the user sets the mode to be fixed to the second mode. The control circuit 70 selects the second mode (S40), and the process returns to S42 when no touch has been detected (N in S42). When a touch is detected (Y in S42), the touch detection circuit 76 executes interpolation processing and coordinate calculation processing (S44) and outputs the coordinates, and the process returns to S42.

In the second mode, as described above, although the accuracy of the detected touch position coordinates may decrease depending on the touch position compared to the first mode, the mode is effective when low accuracy of the coordinates is acceptable. In this exemplary variation, the mode can be set according to the characteristics that the user desires to prioritize.

Second Exemplary Variation in First Embodiment

In the first embodiment, eight touch detection periods are arranged in the frame period Fa; however, the number of touch detection periods arranged in the frame period Fa is not limited to eight. For example, the number of touch detection periods arranged in the frame period Fa may be four, six, or ten.

A thin-film transistor disposed in each pixel is made of amorphous silicon (a-Si) or low temperature polycrystalline silicon (LTPS). Since the response of a-Si transistors is slower than that of LTPS, it is desirable to reduce the number of touch detection periods arranged in the frame period Fa when adopting a-Si transistors. When a-Si transistors are adopted, for example, four touch detection periods can be arranged in the frame period Fa.

In this case, in the configuration of the comparative example shown in FIG. 7, touch detection in a certain touch detection region is performed every 16.6 ms of the frame period Fa. Therefore, for example, when a touch is made in the touch detection region R1 immediately after the touch detection period T1a, this touch is detected in the touch detection period T1a of the next subframe period Fb, and the coordinates are calculated within about 5 ms after the end of the subframe period. Therefore, the first touch response is approximately as follows: 16.6+16.6+5=38.3 ms.

In the second mode in the second exemplary variation, four touch detection periods are arranged in the frame period Fa, and touch detection in the touch detection region R1 is performed at a cycle of about 8.3 ms. Therefore, for example, when a touch is made in the touch detection region R1 immediately after the touch detection period T1a, this touch is detected in the next touch detection period T1a, and the coordinates are calculated within about 5 ms after the end of the subframe period. Therefore, the first touch response is approximately as follows: 8.3+8.3+5=21.6 ms, and a touch made to the screen by an object can be detected earlier compared to the comparative example.

Further, in a case of outputting the touch position information upon detecting that there has been a touch twice in a row, for example, the first touch response is approximately as follows: 16.6+16.6×2+5=53.8 ms, when a touch is made in the touch detection region R1 immediately after the touch detection period T1a in the comparative example.

On the other hand, in the second exemplary variation, in a case of outputting the touch position information upon detecting that there has been a touch twice in a row, for example, the first touch response is approximately as follows: 8.3+8.3×2+5=29.9 ms, when a touch is made in the touch detection region R1 immediately after the touch detection period T1a. In this case as well, detection can be made earlier compared to the comparative example.

Third Exemplary Variation in First Embodiment

In the first embodiment, display periods and touch detection periods are alternately arranged in a frame period; however, multiple touch detection periods may be continuously arranged in a frame period, and the display of one screen may be done in a collective manner after the end of touch detection in the respective touch detection periods. Such control can also be called V-blanking scanning.

Figure 15:
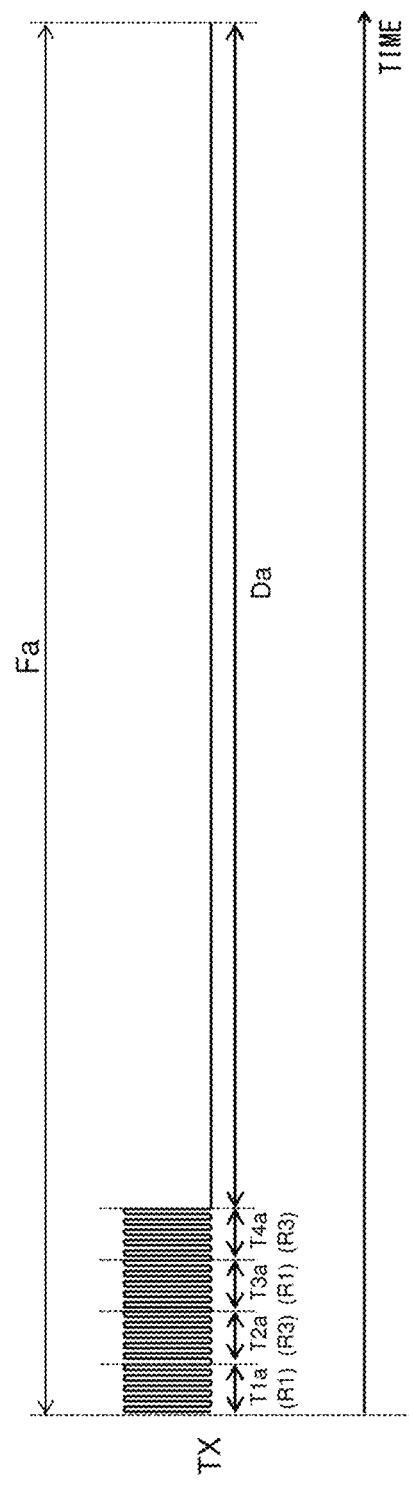
FIG. 15 is a diagram showing times and waveforms of a touch drive signal within a frame period in a second mode according to the third exemplary variation in the first embodiment.

FIG. 15 shows times and waveforms of a touch drive signal TX within a frame period Fa in a second mode according to the third exemplary variation in the first embodiment. In the frame period Fa, a touch detection period T1a, a touch detection period T2a, a touch detection period T3a, and a touch detection period T4a are arranged in order, and a single display period Da is then arranged. It is assumed that the length of one touch detection period is 1 ms.

For example, when a touch is made in a touch detection region R1 immediately after the touch detection period T3a, this touch is detected in a touch detection period T1a of the next frame period Fa, and the coordinates are calculated within about 5 ms after the end of the following touch detection period T2a. The first touch response is approximately as follows: 14.6+2+5=21.6 ms.

On the other hand, when V-blanking scanning is performed in the configuration according to the comparative example shown in FIG. 7, for example, when a touch is made in the touch detection region R1 immediately after the touch detection period T1a, this touch is detected in the touch detection period T1a of the next frame period Fa, and the coordinates are calculated within about 5 ms after the end of the touch detection period T4a. The first touch response is approximately as follows: 16.6+4+5=25.6 ms.

Therefore, even in V-blanking scanning, a touch made to the screen by an object can be detected earlier compared to the comparative example.

Further, when the touch position information is output when a touch is detected twice in a row, for example, when a touch is made in the touch detection region R1 immediately after the touch detection period T3a, this touch is detected in the touch detection period T1a and touch detection period T3a of the next frame period Fa, and the coordinates are calculated within about 5 ms after the end of the following touch detection period T4a in this exemplary variation. The first touch response is approximately as follows: 14.6+4+5=23.6 ms.

Further, when the touch position information is output when a touch is detected twice in a row, for example, when a touch is made in the touch detection region R1 immediately after the touch detection period T1a, this touch is detected in the touch detection period T1a of the next frame period Fa and a touch detection period T1a of the following frame period Fa, and the coordinates are calculated within about 5 ms after the end of the touch detection period T4a in the configuration of the comparative example. The first touch response is approximately as follows: 16.6+16.6+4+5=42.3 ms.

Therefore, even when the touch position information is output when the touch is detected twice in a row in V-blanking scanning, a touch made to the screen by an object can be detected earlier compared to the comparative example.

Second Embodiment

In the second embodiment, the difference from the first embodiment is that multiple common electrodes in two columns are set for one touch detection region. In the following, a description will be given mainly for the difference from the first embodiment.

Figure 16:
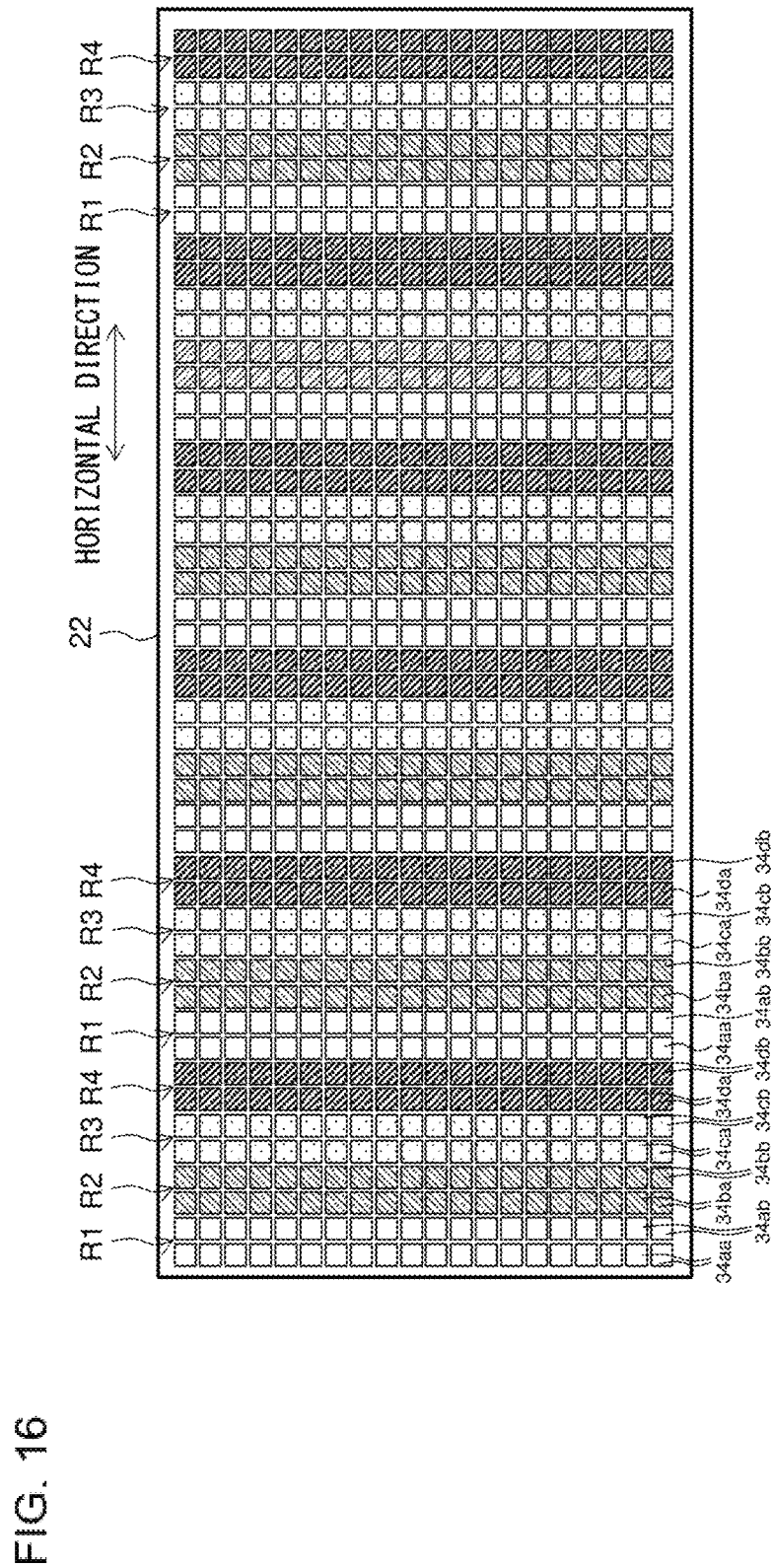
FIG. 16 is a top view showing the arrangement of a touch detection region according to the second embodiment.

FIG. 16 is a top view showing the arrangement of a touch detection region according to the second embodiment. From the left in the same row as seen from the viewer, a first common electrode 34*aa*, a fourth common electrode 34*ab*, a second common electrode 34*ba*, a fifth common electrode 34*bb*, a third common electrode 34*ca*, a sixth common electrode 34*cb*, a seventh common electrode 34*da*, and an eighth common electrode 34*db* are arranged in this order.

Within the same row, the fourth common electrode 34*ab* is adjacent to the first common electrode 34*aa*, the second common electrode 34*ba* is adjacent to the fourth common electrode 34*ab*, and the fifth common electrode 34*bb* is adjacent to the second common electrode 34*ba*. The third common electrode 34*ca* is adjacent to the fifth common electrode 34*bb*, the sixth common electrode 34*cb* is adjacent to the third common electrode 34*ca*, the seventh common electrode 34*da* is adjacent to the sixth common electrode 34*cb*, and the eighth common electrode 34*db* is adjacent to the seventh common electrode 34*da*.

The first common electrode 34*aa*, the second common electrode 34*ba*, and the third common electrode 34*ca* are located within a range where when an object touches the second common electrode 34*ba*, the capacitance of each of the first common electrode 34*aa*, the second common electrode 34*ba*, and the third common electrode 34*ca* changes, allowing for detecting that there has been a touch at each of the electrodes.

In two adjacent columns, 20 first common electrodes 34*aa* and 20 fourth common electrodes 34*ab*, 20 second common electrodes 34*ba* and 20 fifth common electrodes 34*bb*, 20 third common electrodes 34*ca* and 20 sixth common electrodes 34*cb*, or 20 seventh common electrodes 34*da* and 20 eighth common electrodes 34*db* are arranged.

The display device 22 includes six touch detection regions R1, six touch detection regions R2, six touch detection regions R3, and six touch detection regions R4. Each touch detection region R1 includes 20 first common electrodes 34*aa* and 20 fourth common electrodes 34*ab* in two adjacent columns. Each touch detection region R2 includes 20 second common electrodes 34*ba* and 20 fifth common electrodes 34*bb* in two adjacent columns. Each touch detection region R3 includes 20 third common electrodes 34*ca* and 20 sixth common electrodes 34*cb* in two adjacent columns. Each touch detection region R4 includes 20 seventh common electrodes 34*da* and 20 eighth common electrodes 34*db* in two adjacent columns. A touch detection region R1, a touch detection region R2, a touch detection region R3, and a touch detection region R4 are horizontally arranged repeatedly in order from the left to the right when viewed from the viewer.

Figure 17:
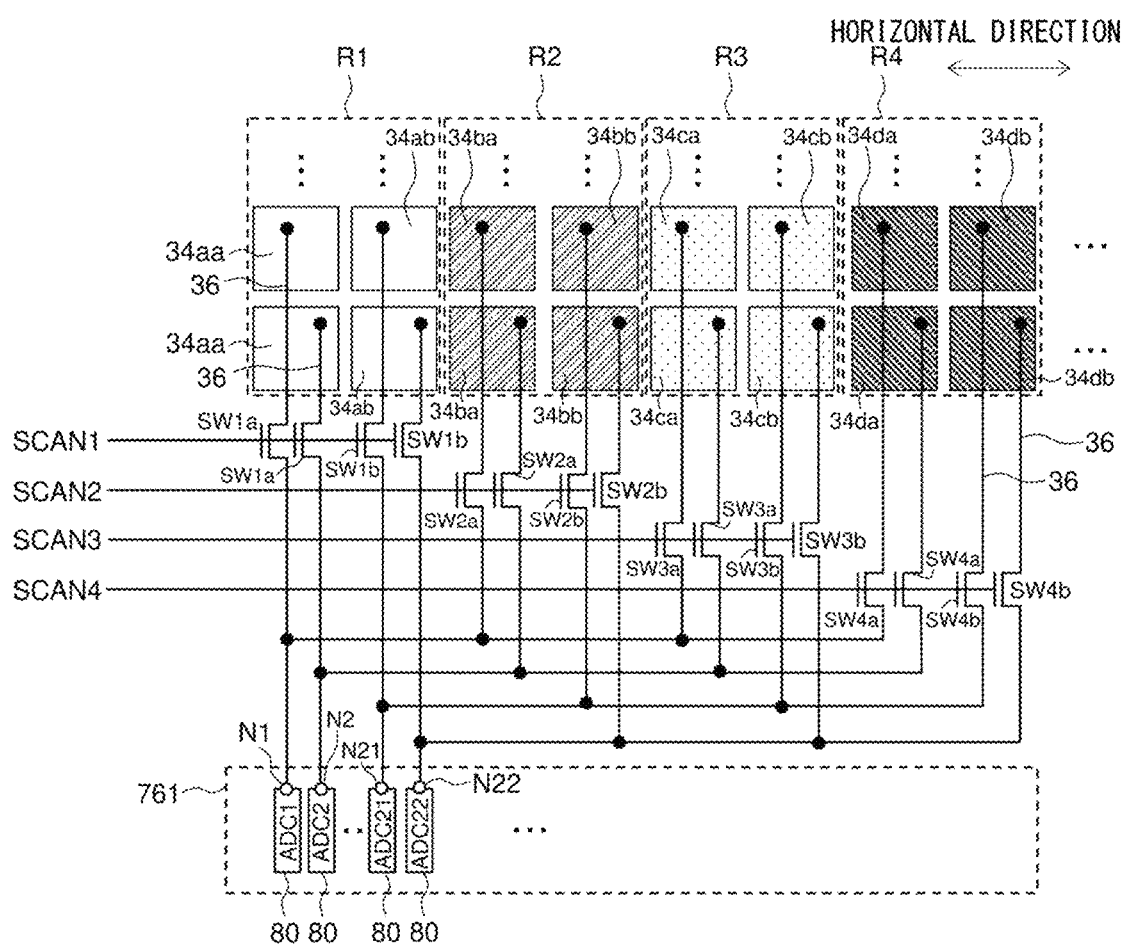
FIG. 17 is a diagram showing the connection of the common electrodes shown, first switches, etc., and an A/D converter in FIG. 16.

FIG. 17 shows the connection of the common electrodes 34, the first switches SW1, etc., and the A/D converter 761 shown in FIG. 16. FIG. 17 shows some of the common electrodes 34, etc. In FIG. 17 and the following description, when multiple first common electrodes 34*aa* are to be distinguished from one another, the first common electrodes 34*aa* are denoted as a first common electrode 34*aa*_1, a first common electrode 34*aa*_2, and so on. In other words, the n-th first common electrode 34*aa* is denoted as "first common electrode 34*aa*_n" where n is an integer from 1 to 120. In the same manner, the n-th fourth common electrode 34*ab* is denoted as "fourth common electrode 34*ab*_n" when the multiple fourth common electrodes 34*ab* are to be distinguished from one another. The n-th second common electrode 34*ba* is denoted as "second common electrode 34*ba*_n" when the multiple second common electrodes 34*ba* are to be distinguished from one another. The n-th fifth common electrode 34*bb* is denoted as "fifth common electrode 34*bb*_n" when the multiple fifth common electrodes 34*bb* are to be distinguished from one another. The n-th third common electrode 34*ca* is denoted as "third common electrode 34*ca*_n" when the multiple third common electrodes 34*ca* are to be distinguished from one another. The n-th sixth common electrode 34*cb* is denoted as "sixth common electrode 34*cb*_n" when the multiple sixth common electrodes 34*cb* are to be distinguished from one another. The n-th seventh common electrode 34*da* is denoted as "seventh common electrode 34*da*_n" when the multiple seventh common electrodes 34*da* are to be distinguished from one another. The n-th eighth common electrode 34*db* is denoted as "eighth common electrode 34*db*_n" when the multiple eighth common electrodes 34*db* are to be distinguished from one another. The display device 22 includes 120 first signal lines 36*aa*, 120 fourth signal lines 36*ab*, 120 second signal lines 36*ba*, 120 fifth signal lines 36*bb*, 120 third signal lines 36*ca*, 120 sixth signal lines 36*cb*, 120 seventh signal lines 36*da*, and 120 eighth signal lines 36*db*. In FIG. 17 and the following description, the n-th first signal line 36*aa* is denoted as "first signal line 36*aa*_n" when the multiple first signal lines 36*aa* are to be distinguished from one another. The n-th fourth signal line 36*ab* is denoted as "fourth signal line 36*ab*_n" when the multiple fourth signal lines 36*ab* are to be distinguished from one another. The n-th second signal line 36*ba* is denoted as "second signal line 36*ba*_n" when the multiple second signal lines 36*ba* are to be distinguished from one another. The n-th fifth signal line 36*bb* is denoted as "fifth signal line 36*bb*_n" when the multiple fifth signal lines 36*bb* are to be distinguished from one another. The n-th third signal line 36*ca* is denoted as "third signal line 36*ca*_n" when the multiple third signal lines 36*ca* are to be distinguished from one another. The n-th sixth signal line 36*cb* is denoted as "sixth signal line 36*cb*_n" when the multiple sixth signal lines 36*cb* are to be distinguished from one another. The n-th seventh signal line 36*da* is denoted as "seventh signal line 36*da*_n" when the multiple seventh signal lines 36*da* are to be distinguished from one another. The n-th eighth signal line 36*db* is denoted as "eighth signal line 36*db*_n" when the multiple eighth signal lines 36*db* are to be distinguished from one another. The touch detection circuit 76 has 120 first switch SW1*a*, 120 fourth switch SW1*b*, 120 second switch SW2*a*, 120 fifth switch SW2*b*, 120 third switch SW3*a*, 120 sixth switch SW3*b*, 120 seventh switch SW4*a*, and 120 eighth switch SW4*b*. In FIG. 17 and the following description, the n-th first switch SW1*a* is denoted as "first switch SW1*a*_n" when the multiple first switches SW1*a* are to be distinguished from one another. The n-th fourth switch SW1*b* is denoted as "fourth switch SW1*b*_n" when the multiple fourth switches SW1*b* are to be distinguished from one another. The n-th second switch SW2*a* is denoted as "second switch SW2*a*_n" when the multiple second switches SW2 are to be distinguished from one another. The n-th fifth switch SW2*b* is denoted as "fifth switch SW2*b*_n" when the multiple fifth switches SW2*b* are to be distinguished from one another. The n-th third switch SW3*a* is denoted as "third switch SW3*a*_n" when the multiple third switches SW3*a* are to be distinguished from one another. The n-th sixth switch SW3*b* is denoted as "sixth switch SW3*b*_n" when the multiple sixth switches SW3*b* are to be distinguished from one another. The n-th seventh switch SW4*a* is denoted as "seventh switch SW4*a*_n" when the multiple seventh switches SW4*a* are to be distinguished from one another. The n-th eighth switch SW4*b* is denoted as "eighth switch SW4*b*_n" when the multiple eighth switches SW4*b* are to be distinguished from one another.

The 120 first common electrodes 34*aa* and the 120 first switches SW1*a* correspond to each other in a one-to-one manner. The 120 first switches SW1*a* and half of the 240 A/D conversion circuits 80 correspond to each other in a one-to-one manner. Each of the 120 first switches SW1*a* is connected between the first signal line 36*aa* connected to the corresponding first common electrode 34*aa* and the corresponding input node, and switches between conduction and non-conduction between the corresponding first common electrode 34*aa* and the corresponding input node based on a control signal SCAN1. In other words, the first switch SW1*a*_n is connected between the first signal line 36*aa*_n and the input node Nm, and switches between conduction and non-conduction between the first common electrode 34aa_n and the input node Nm. In this case, the following are established: m=n when n=1 to 20; m=n+20 when n=21 to 40; m=n+40 when n=41 to 60; m=n+60 when n=61 to 80; m=n+80 when n=81 to 100; and m=n+100 when n=101 to 120.

The 120 fourth common electrodes 34ab and the 120 fourth switches SW1b correspond to each other in a one-to-one manner. The 120 fourth switches SW1b and the remaining half of the 240 A/D conversion circuits 80 correspond to each other in a one-to-one manner. Each of the 120 fourth switches SW1b is connected between the fourth signal line 36ab connected to the corresponding fourth common electrode 34ab and the corresponding input node, and switches between conduction and non-conduction between the corresponding fourth common electrode 34ab and the corresponding input node based on a control signal SCAN1. In other words, the fourth switch SW1b_n is connected between the fourth signal line 36ab_n and the input node Nm, and switches between conduction and non-conduction between the fourth common electrode 34ab_n and the input node Nm. In this case, the following are established: m=n+20 when n=1 to 20; m=n+40 when n=21 to 40; m=n+60 when n=41 to 60; m=n+80 when n=61 to 80; m=n+100 when n=81 to 100; and m=n+120 when n=101 to 120.

The 120 second common electrodes 34ba and the 120 second switches SW2a correspond to each other in a one-to-one manner. The 120 second switches SW2a and half of the 240 A/D conversion circuits 80 correspond to each other in a one-to-one manner. Each of the 120 second switches SW2a is connected between the second signal line 36ba connected to the corresponding second common electrode 34ba and the corresponding input node, and switches between conduction and non-conduction between the corresponding second common electrode 34ba and the corresponding input node based on a control signal SCAN2. In other words, the second switch SW2a_n is connected between the second signal line 36ba_n and the input node Nm, and switches between conduction and non-conduction between the second common electrode 34ba_n and the input node Nm. In this case, the following are established: m=n when n=1 to 20; m=n+20 when n=21 to 40; m=n+40 when n=41 to 60; m=n+60 when n=61 to 80; m=n+80 when n=81 to 100; and m=n+100 when n=101 to 120.

The 120 fifth common electrodes 34bb and the 120 fifth switches SW2b correspond to each other in a one-to-one manner. The 120 fifth switches SW2b and the remaining half of the 240 A/D conversion circuits 80 correspond to each other in a one-to-one manner. Each of the 120 fifth switches SW2b is connected between the fifth signal line 36bb connected to the corresponding fifth common electrode 34bb and the corresponding input node, and switches between conduction and non-conduction between the corresponding fifth common electrode 34bb and the corresponding input node based on a control signal SCAN2. In other words, the fifth switch SW2b_n is connected between the fifth signal line 36bb_n and the input node Nm, and switches between conduction and non-conduction between the fifth common electrode 34bb_n and the input node Nm. In this case, the following are established: m=n+20 when n=1 to 20; m=n+40 when n=21 to 40; m=n+60 when n=41 to 60; m=n+80 when n=61 to 80; m=n+100 when n=81 to 100; and m=n+120 when n=101 to 120.

The 120 third common electrodes 34ca and the 120 third switches SW3a correspond to each other in a one-to-one manner. The 120 third switches SW3a and half of the 240 A/D conversion circuits 80 correspond to each other in a one-to-one manner. Each of the 120 third switches SW3a is connected between the third signal line 36ca connected to the corresponding third common electrode 34ca and the corresponding input node, and switches between conduction and non-conduction between the corresponding third common electrode 34ca and the corresponding input node based on a control signal SCAN3. In other words, the third switch SW3a_n is connected between the third signal line 36ca_n and the input node Nm, and switches between conduction and non-conduction between the third common electrode 34ca_n and the input node Nm. In this case, the following are established: m=n when n=1 to 20; m=n+20 when n=21 to 40; m=n+40 when n=41 to 60; m=n+60 when n=61 to 80; m=n+80 when n=81 to 100; and m=n+100 when n=101 to 120.

The 120 sixth common electrodes 34cb and the 120 sixth switches SW3b correspond to each other in a one-to-one manner. The 120 sixth switches SW3b and the remaining half of the 240 A/D conversion circuits 80 correspond to each other in a one-to-one manner. Each of the 120 sixth switches SW3b is connected between the sixth signal line 36cb connected to the corresponding sixth common electrode 34cb and the corresponding input node, and switches between conduction and non-conduction between the corresponding sixth common electrode 34cb and the corresponding input node based on a control signal SCAN3. In other words, the sixth switch SW3b_n is connected between the sixth signal line 36cb_n and the input node Nm, and switches between conduction and non-conduction between the sixth common electrode 34cb_n and the input node Nm. In this case, the following are established: m=n+20 when n=1 to 20; m=n+40 when n=21 to 40; m=n+60 when n=41 to 60; m=n+80 when n=61 to 80; m=n+100 when n=81 to 100; and m=n+120 when n=101 to 120.

The 120 seventh common electrodes 34da and the 120 seventh switches SW4a correspond to each other in a one-to-one manner. The 120 seventh switches SW4a and half of the 240 A/D conversion circuits 80 correspond to each other in a one-to-one manner. Each of the 120 seventh switches SW4a is connected between the seventh signal line 36da connected to the corresponding seventh common electrode 34da and the corresponding input node, and switches between conduction and non-conduction between the corresponding seventh common electrode 34da and the corresponding input node based on a control signal SCAN4. In other words, the seventh switch SW4a_n is connected between the seventh signal line 36da_n and the input node Nm, and switches between conduction and non-conduction between the seventh common electrode 34da_n and the input node Nm. In this case, the following are established: m=n when n=1 to 20; m=n+20 when n=21 to 40; m=n+40 when n=41 to 60; m=n+60 when n=61 to 80; m=n+80 when n=81 to 100; and m=n+100 when n=101 to 120.

The 120 eighth common electrodes 34db and the 120 eighth switches SW4b correspond to each other in a one-to-one manner. The 120 eighth switches SW4b and the remaining half of the 240 A/D conversion circuits 80 correspond to each other in a one-to-one manner. Each of the 120 eighth switches SW4b is connected between the eighth signal line 36db connected to the corresponding eighth common electrode 34db and the corresponding input node, and switches between conduction and non-conduction between the corresponding eighth common electrode 34db and the corresponding input node based on a control signal SCAN4. In other words, the eighth switch SW4b_n is connected between the eighth signal line 36db_n and the input node Nm, and switches between conduction and non-conduction between the eighth common electrode 34db_n and the input node Nm. In this case, the following are established: m=n+20 when n=1 to 20; m=n+40 when n=21 to 40; m=n+60 when n=41 to 60; m=n+80 when n=61 to 80; m=n+100 when n=81 to 100; and m=n+120 when n=101 to 120.

According to this configuration, the same effects as those in the first embodiment are obtained. Further, the degree of freedom in the arrangement of the touch detection region can be improved.

Third Embodiment

In the third embodiment, the difference from the first embodiment is that one touch detection region is formed by one common electrode. In the following, a description will be given mainly for the differences from the first embodiment.

Figure 18:
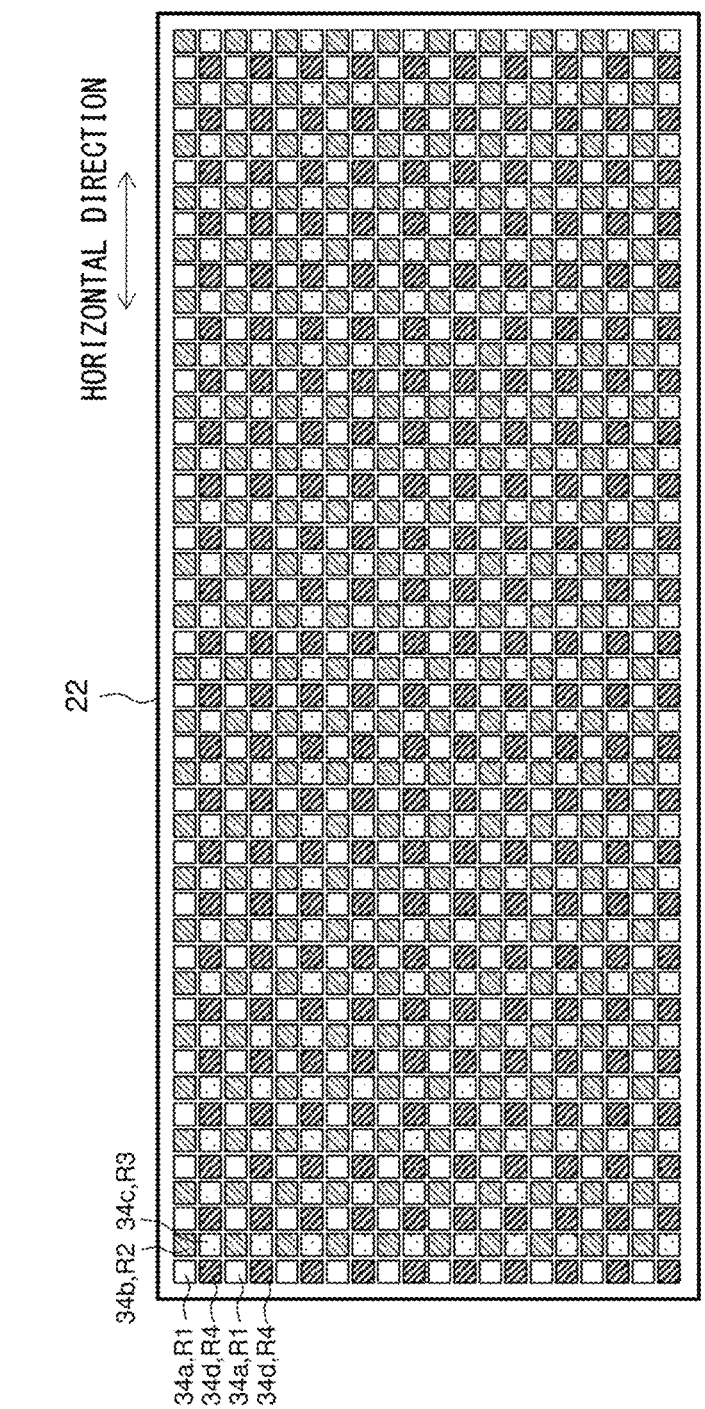
FIG. 18 is a top view showing the arrangement of a touch detection region according to the third embodiment.

FIG. 18 is a top view showing the arrangement of a touch detection region according to the third embodiment. First common electrodes 34a and second common electrodes 34b are located in the same row, second common electrodes 34b and third common electrodes 34c are located in the same column, and first common electrodes 34a and fourth common electrodes 34d are located in the same column.

In the first type rows, which are half the rows, 24 first common electrodes 34a and 24 second common electrodes 34b are arranged in the same row, and the first common electrodes 34a and the second common electrodes 34b are alternately arranged.

The second type rows, which are the remaining half of the rows, 24 third common electrodes 34c and 24 fourth common electrodes 34d are arranged in the same row, and the third common electrodes 34c and the fourth common electrodes 34d are alternately arranged. The first type rows and the second type rows are arranged alternately in the column direction.

In the first type columns, which are half the columns, 10 first common electrodes 34a and 10 third common electrodes 34c are arranged in the same column, and the first common electrodes 34a and the third common electrodes 34c are alternately arranged.

The second type columns, which are the remaining half of the columns, 10 second common electrodes 34b and 10 fourth common electrodes 34d are arranged in the same column, and the second common electrodes 34b and the fourth common electrodes 34d are alternately arranged. The first type columns and the second type columns are arranged alternately in the row direction.

The display device 22 includes 240 touch detection regions R1, 240 touch detection regions R2, 240 touch detection regions R3, and 240 touch detection regions R4. Each touch detection region R1 includes one first common electrode 34a. Each touch detection region R2 includes one second common electrode 34b. Each touch detection region R3 includes one third common electrode 34c. Each touch detection region R4 includes one fourth common electrode 34d.

Figure 19:
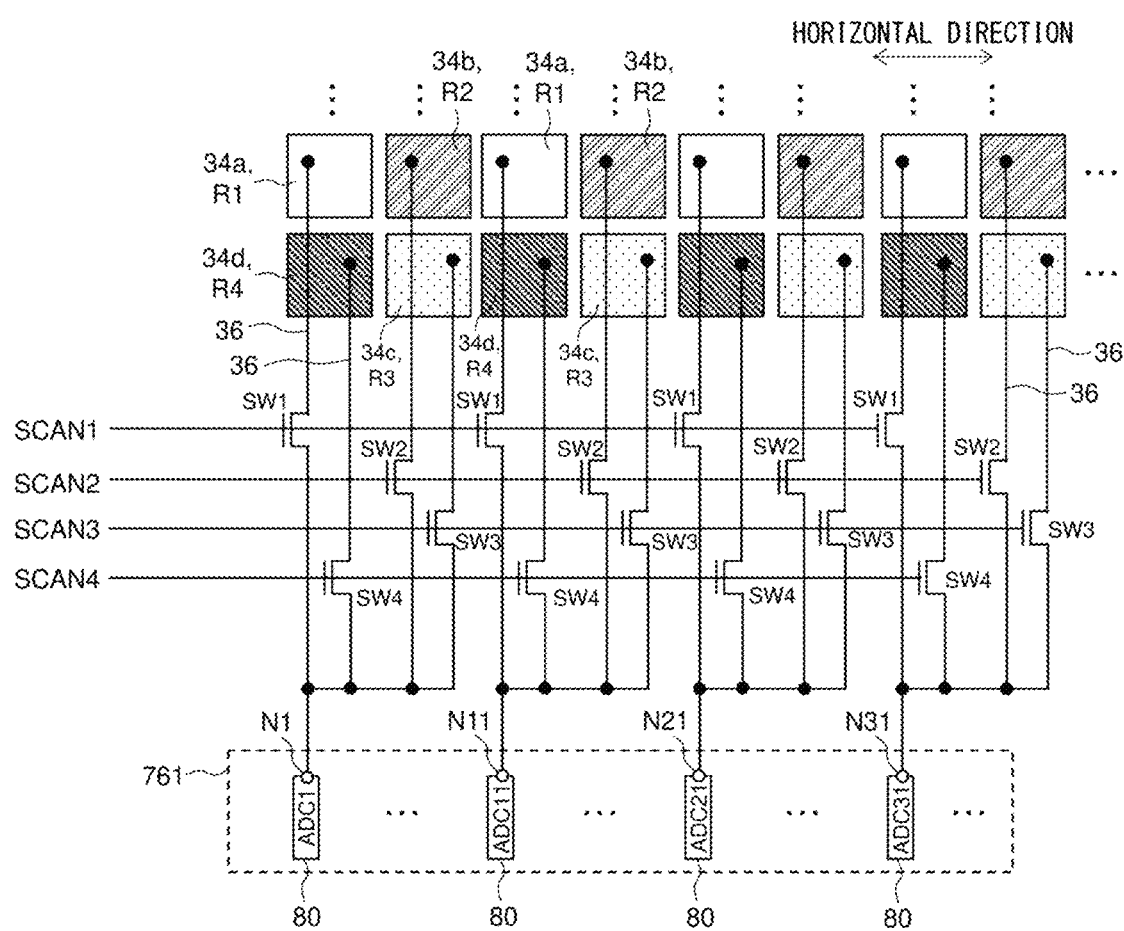
FIG. 19 is a diagram showing the connection of the common electrodes, first switches, etc., and an A/D converter shown in FIG. 18.

FIG. 19 shows the connection of the common electrodes 34, the first switches SW1, etc., and the A/D converter 761 shown in FIG. 18. FIG. 19 shows some of the common electrodes, etc. Since the arrangement of first common electrodes 34a, second common electrodes 34b, third common electrodes 34c, and fourth common electrodes 34d is different from that in FIG. 4, the physical arrangement of signal lines 36 is also different; however, the electrical connection of multiple components is the same as that in FIG. 4.

In the second mode, for example, when a touch is made in a touch detection region R1 immediately after the touch detection period T1a, this touch is detected in at least one of four touch detection regions R3 around the touch detection region R1 with the touch in the next touch detection period T3a. Therefore, in this condition, the detection can be made earlier compared to the first embodiment. Therefore, the detection capability can be enhanced. Further, the degree of freedom in the arrangement of the touch detection region can be improved.

The second common electrodes 34b and the fourth common electrodes 34d may be interchanged. In other words, the first common electrodes 34a and the second common electrodes 34b may be located in the same column, and the second common electrodes 34b and the third common electrodes 34c may be located in the same row.

Fourth Embodiment

The fourth embodiment differs from the first embodiment in that the long side of the detection region is along the horizontal direction. In the following, a description will be given mainly for the differences from the first embodiment.

Figure 20:
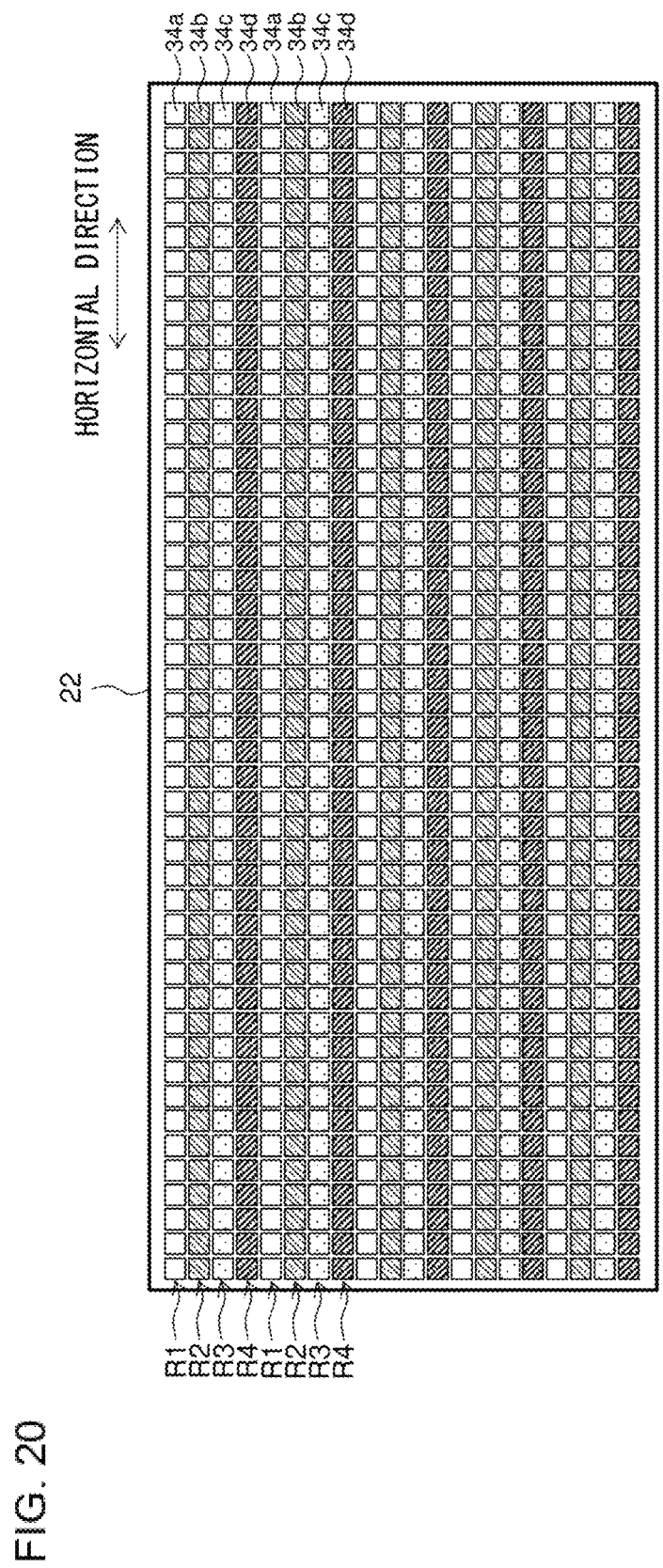
FIG. 20 is a diagram showing the arrangement of a touch detection region according to the fourth embodiment.

FIG. 20 shows the arrangement of a touch detection region according to the fourth embodiment. Within the same column, a second common electrode 34b is adjacent to a first common electrode 34a, a third common electrode 34c is adjacent to the second common electrode 34b, a fourth common electrode 34d is adjacent to the third common electrode 34c, and the first common electrode 34a is adjacent to the fourth common electrode 34d.

In the same row, 48 first common electrodes 34a, 48 second common electrodes 34b, 48 third common electrodes 34c, or 48 fourth common electrodes 34d are arranged.

The display device 22 includes five touch detection regions R1, five touch detection regions R2, five touch detection regions R3, and five touch detection regions R4. Each touch detection region R1 includes 48 first common electrodes 34a in one row. Each touch detection region R2 includes 48 second common electrodes 34b in one row. Each touch detection region R3 includes 48 third common electrodes 34c in one row. Each touch detection region R4 includes 48 fourth common electrodes 34d in one row.

A touch detection region R1, a touch detection region R2, a touch detection region R3, and a touch detection region R4 are vertically arranged repeatedly in order from the top to the bottom when viewed from the viewer.

Figure 21:
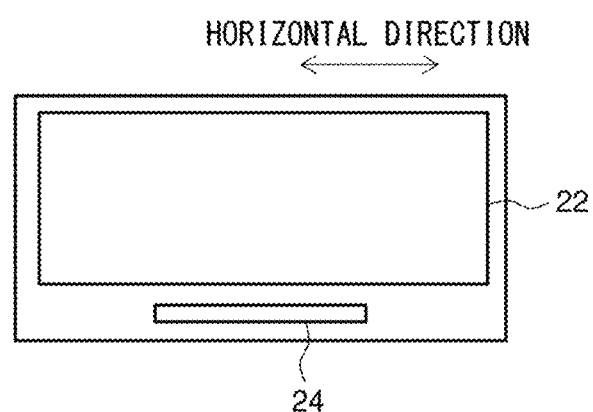
FIG. 21 is a diagram showing the arrangement of a display device and a control device according to the fourth embodiment.

FIG. 21 is a diagram showing the arrangement of a display device 22 and a control device 24 according to the fourth embodiment. FIG. 21 is a diagram of a display surface of the display device 22 as viewed from the viewer's side. The control device 24 configured as an IC is arranged on the lower side of the display device 22 in a plane view.

Figure 22:
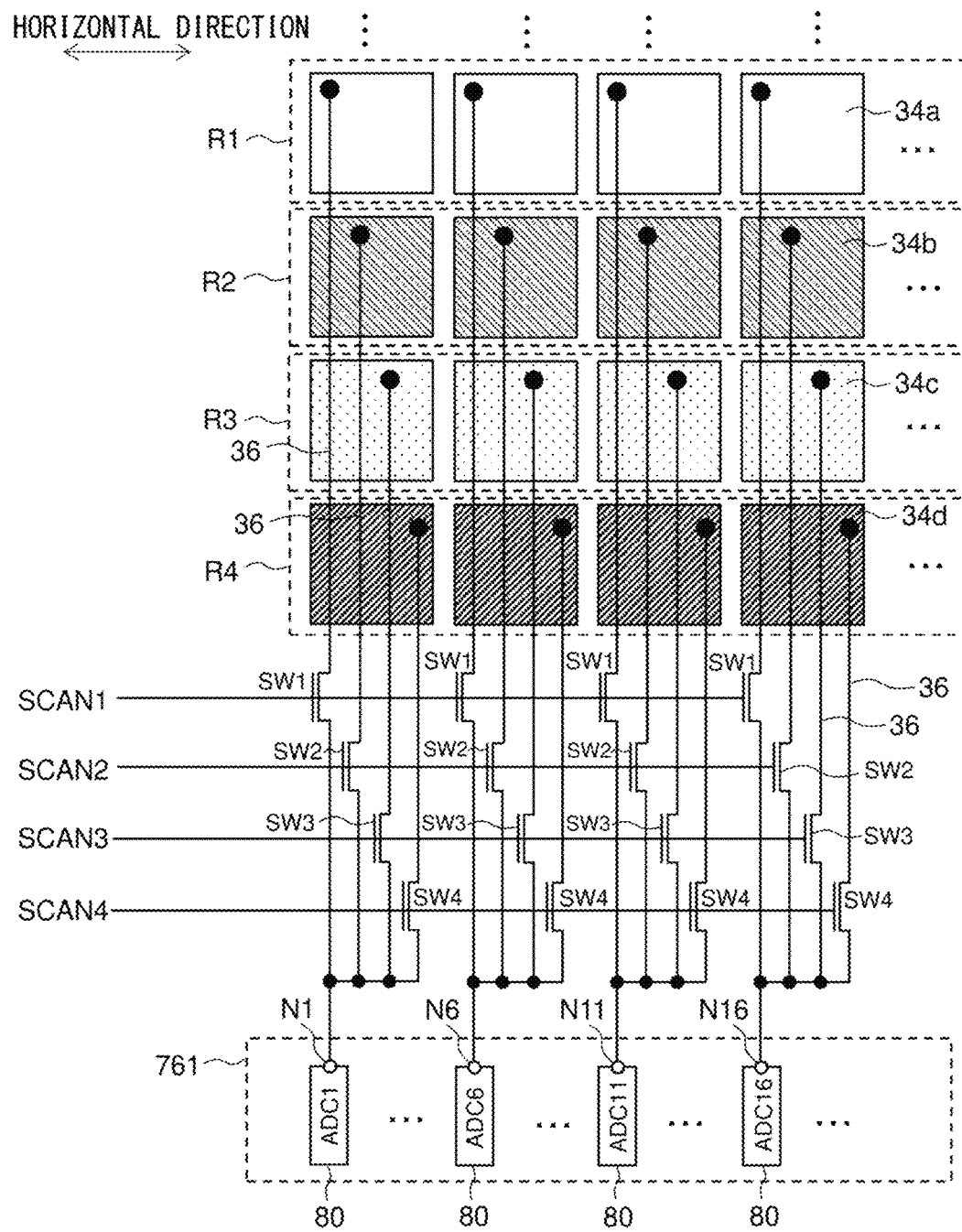
FIG. 22 is a diagram showing the connection of the common electrodes, first switches, etc., and an A/D converter that correspond to those in FIG. 21.

FIG. 22 shows the connection of the common electrodes 34, the first switches SW1, etc., and the A/D converter 761 corresponding to those in FIG. 21. FIG. 22 shows some of the common electrodes, etc., and schematically shows the positional relationship of multiple components viewed from the viewer side. Since the arrangement of first common electrodes 34a, second common electrodes 34b, third common electrodes 34c, and fourth common electrodes 34d is different from that in FIG. 4, the physical arrangement of signal lines 36 is also different; however, the electrical connection of multiple components is the same as that in FIG. 4. The common electrodes 34, the first switches SW1, etc., are connected by signal lines 36 extending in a vertical direction. The control device 24 may be arranged on the upper side of the display device 22 in a plane view.

Figure 23:
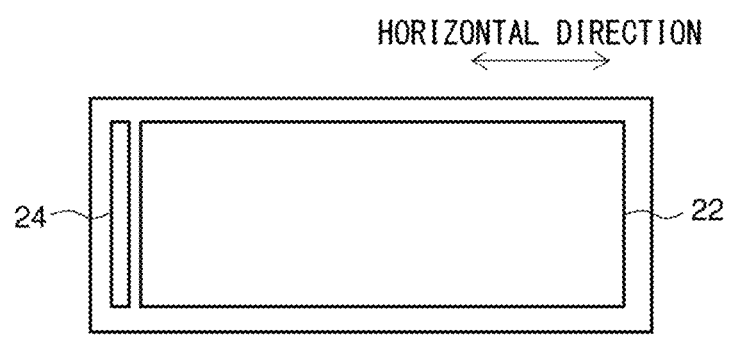
FIG. 23 is a diagram showing another arrangement of the display device and the control device according to the fourth embodiment.

FIG. 23 is a diagram showing another arrangement of the display device 22 and the control device 24 according to the fourth embodiment. The control device 24 is arranged on the left side of the display device 22 in a plane view.

Figure 24:
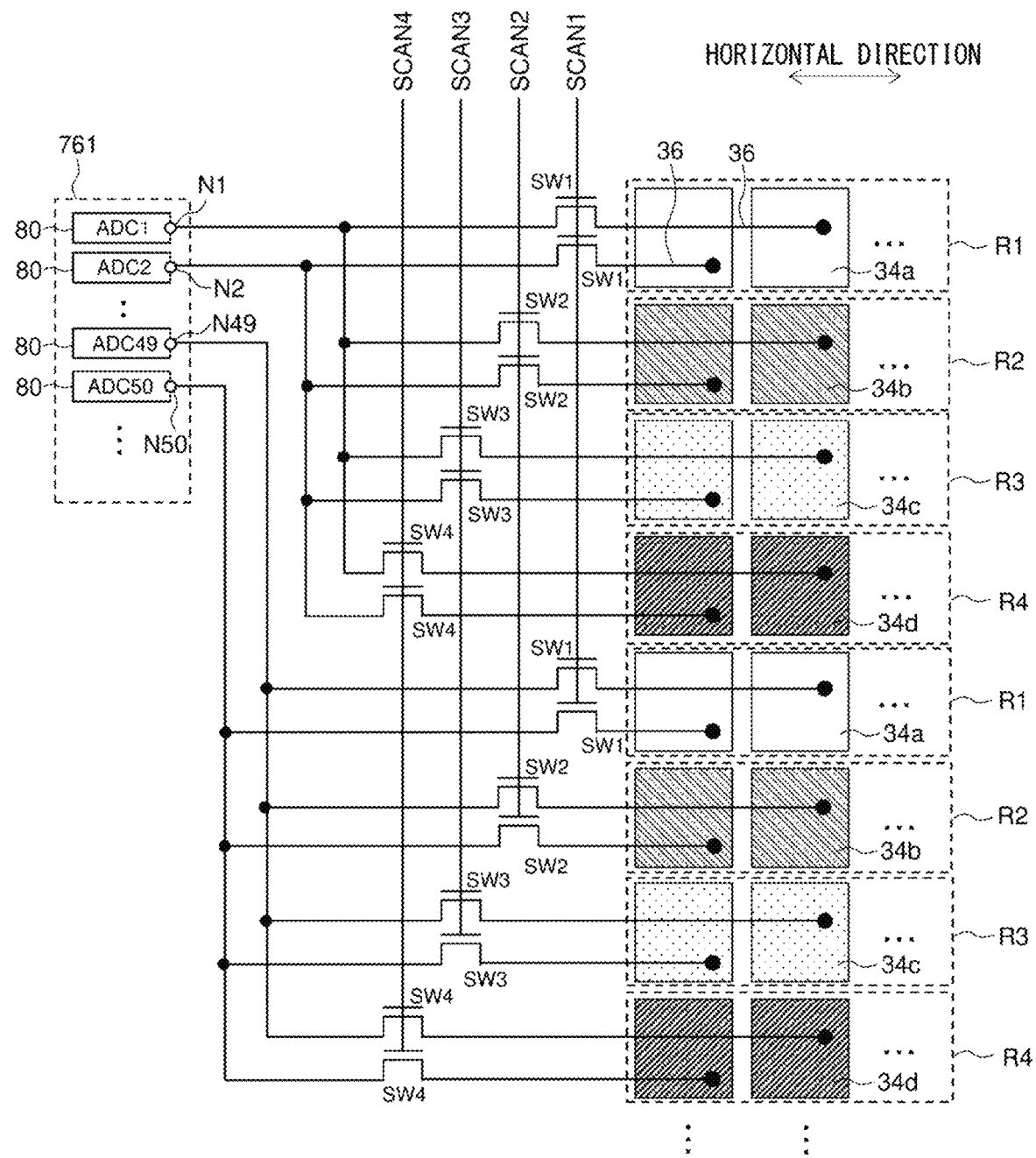
FIG. 24 is a diagram showing the connection of the common electrodes, first switches, etc., and an A/D converter that correspond to those in FIG. 23.

FIG. 24 shows the connection of the common electrodes 34, the first switches SW1, etc., and the A/D converter 761 corresponding to those in FIG. 23. The common electrodes 34, the first switches SW1, etc., are connected by signal lines 36 extending in a horizontal direction.

The control device 24 may be arranged on the right side of the display device 22 in a plane view. In the second embodiment, the long side of a touch detection region may be along the horizontal direction. In the first to third embodiments, the arrangement in FIG. 21 or FIG. 23 can be employed.

The present disclosure has been described with reference to embodiments. The embodiments are intended to be illustrative only, and it will be obvious to those skilled in the art that various modifications to a combination of constituting elements or processes in the embodiments could be developed and that such modifications also fall within the scope of the present disclosure.

For example, in the second embodiment, multiple common electrodes 34 in three or more columns may be treated as one touch detection region. Note that a first common electrode 34a, a second common electrode 34b, and a third common electrode 34c need to be located within a range where when an object touches the second common electrode 34b, the capacitance of each of the first common electrode 34a, the second common electrode 34b, and the third common electrode 34c changes, allowing for detecting that there has been the touch at each of the electrodes.

Although the control device 24 is included in the display module 20 in the embodiments, the control device 24 may be included in the host 10. Also, although the first drive circuit 72 generates the reference clock signal in the embodiments, the second drive circuit 74 may generate the reference clock signal. Also, the number of touch detection periods included in a frame period may be more than three times the number of touch detection regions in the display device 22. These modifications allow greater flexibility in the configuration of the display system 1.

Figure 25:
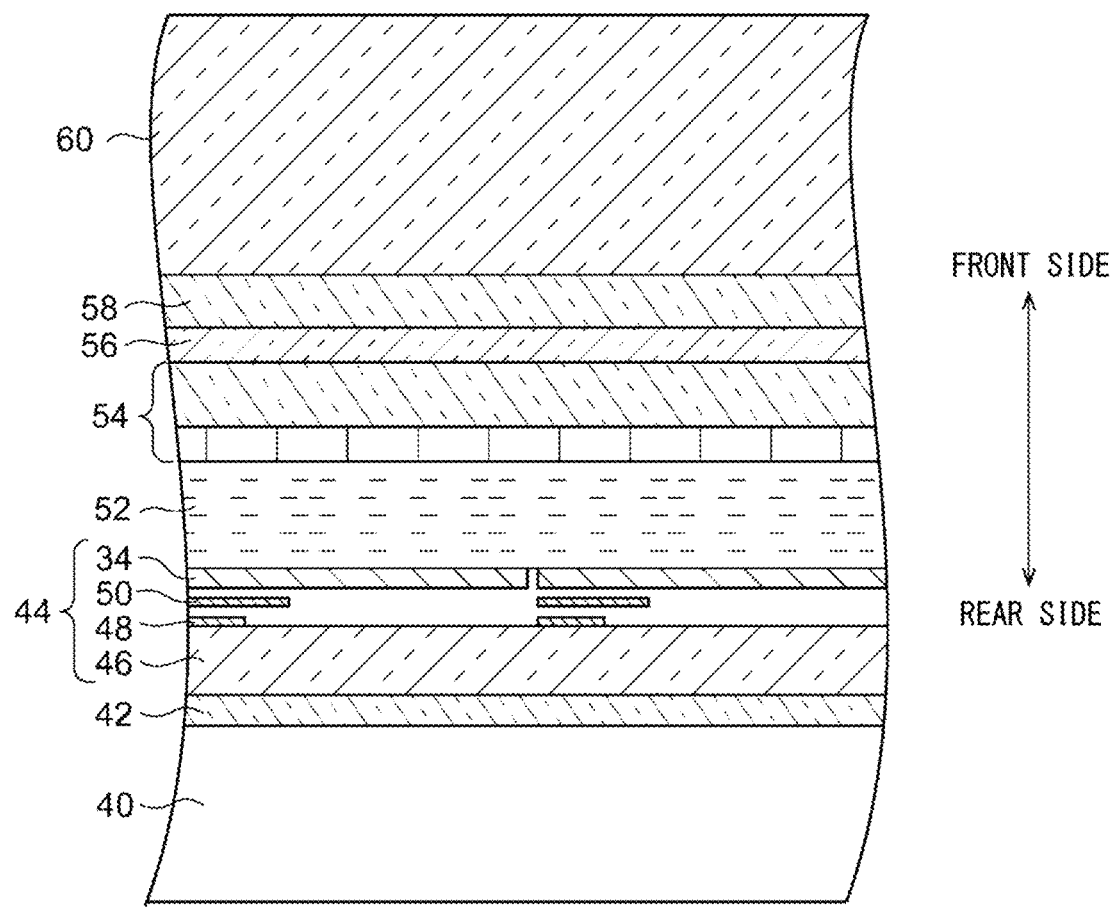
FIG. 25 is a longitudinal sectional view of the display device shown in FIG. 1.

The display device 22 may have a configuration as described below, for example. FIG. 25 is a longitudinal sectional view of a display device 22 shown in FIG. 1. The display device 22 includes a backlight unit 40, a lower polarizer 42, a thin-film transistor substrate (hereinafter, referred to as a TFT substrate) 44, a liquid crystal layer 52, a color filter substrate 54, an upper polarizer 56, a bonding layer 58, and a protection layer 60, which are laminated and disposed in this order along a depth direction.

In the following, with regard to the depth directions of the display device 22, the side on which the protection layer 60 is positioned with respect to the TFT substrate 44 is defined as the front side, and the opposite side is defined as the rear side.

Using the light emitted from the backlight unit 40, the display device 22 emits image light toward the front side, or the viewer side.

The TFT substrate 44 includes a glass substrate 46 and also includes multiple gate electrodes 48, multiple source electrodes 50, and multiple common electrodes 34, which are arranged on the front side of the glass substrate 46. The TFT substrate 44 also includes the multiple gate lines G1, gate lines G2, and so on, the multiple source lines S1, source lines S2, and so on, the multiple pixel electrodes 32, and the multiple pixel switching elements 30 shown in FIG. 2, though the illustration thereof is omitted. The liquid crystal layer 52 disposed on the front side of the TFT substrate 44 is controlled by means of lateral electric fields that occur between pixel electrodes 32 and common electrodes 34.

The bonding layer 58 has translucency and bonds the upper polarizer 56 and the protection layer 60. The bonding layer 58 may be formed by curing transparent resin in a liquid state, such as optically clear resin (OCR), or curing a transparent adhesive sheet, such as optically clear adhesive (OCA), for example.

The protection layer 60 is a layer that has translucency and protects the display device 22, and the protection layer 60 is constituted by a glass substrate or a plastic substrate, for example. The protection layer 60 is also called a cover lens, for example.

A display system according to one aspect of the present disclosure is as follows.

The display system includes:
a display device that has a plurality of common electrodes arranged in a matrix and shared for image display and touch detection; and
a control device that controls the display device,
wherein the control device includes a touch detection circuit that performs detection of the presence or absence of a touch made by an object to the display device, based on a touch detection signal received from each of the plurality of common electrodes,
wherein the touch detection circuit includes:
a first A/D conversion circuit that performs A/D conversion on a signal supplied to a first input node; and
a second A/D conversion circuit that performs A/D conversion on a signal supplied to a second input node, and
detects the presence or absence of a touch based on a signal A/D converted by the first A/D conversion circuit and a signal A/D converted by the second A/D conversion circuit,
wherein the plurality of common electrodes have a first common electrode, a second common electrode, and a third common electrode,
wherein one of a set of the first common electrode and the second common electrode and a set of the first common electrode and the third common electrode is arranged in the same column, the other set is arranged in the same row, and the electrodes in at least one of the set of the first common electrode and the second common electrode and the set of the first common electrode and the third common electrode are adjacent to each other,
wherein the display device includes:
a first signal line that is connected to the first common electrode;
a second signal line that is connected to the second common electrode; and
a third signal line that is connected to the third common electrode, and
wherein the control device includes:
a first switch that is connected between the first signal line and the first input node and that switches between conduction and non-conduction between the first common electrode and the first input node;
a second switch that is connected between the second signal line and the second input node and that switches between conduction and non-conduction between the second common electrode and the second input node;

a third switch that is connected between the third signal line and the first input node and that switches between conduction and non-conduction between the third common electrode and the first input node;

a first control signal line that is connected to the first switch and the second switch and switches on and off of the first switch and on and off of the second switch; and a second control signal line that is connected to the third switch and switches on and off of the third switch.

The input nodes N1 according to the first, second, and fourth embodiments are examples of the first input node. The input nodes N2 according to the first, second, and fourth embodiments are examples of the second input node. The A/D conversion circuits 80_1 according to the first, second, and fourth embodiments are examples of the first A/D conversion circuit. The A/D conversion circuits 80_2 according to the first, second, and fourth embodiments are examples of the second A/D conversion circuit. The first common electrodes 34a_1 according to the first and fourth embodiments and the first common electrode 34aa_1 according to the second embodiment are examples of the first common electrode. The first common electrodes 34a_2 according to the first and fourth embodiments and the first common electrode 34aa_2 according to the second embodiment are examples of the second common electrode. The second common electrodes 34b_1 according to the first and fourth embodiments and the second common electrode 34ba_1 according to the second embodiment are examples of the third common electrode. The first signal lines 36a_1 according to the first and fourth embodiments and the first signal line 36aa_1 according to the second embodiment are examples of the first signal line. The first signal lines 36a_2 according to the first and fourth embodiments and the first signal line 36aa_2 according to the second embodiment are examples of the second signal line. The second signal lines 36b_1 according to the first and fourth embodiments and the second signal line 36ba_1 according to the second embodiment are examples of the third signal line. The first switch SW1_1 according to the first and fourth embodiments and the first switch SW1a_1 according to the second embodiment are examples of the first switch. The first switch SW1_2 according to the first and fourth embodiments and the first switch SW1a_2 according to the second embodiment are examples of the second switch. The second switch SW2_1 according to the first and fourth embodiments and the second switch SW2a_1 according to the second embodiment are examples of the third switch.

According to this aspect, faster response to touch detection is enabled.

In the display system according to the one aspect of the present disclosure, for example, the first common electrode and the second common electrode may be adjacent to each other, and the first common electrode and the third common electrode may be adjacent to each other.

In this case, the capacitance of each of the second common electrode and the third common electrode can be changed when an object touches the first common electrode.

In the display system according to the one aspect of the present disclosure, for example, the first common electrode and the second common electrode may be located in the same row, and the first common electrode and the third common electrode may be located in the same column.

This allows greater flexibility in the configuration of the display system.

In the display system according to the one aspect of the present disclosure, for example, the first common electrode and the second common electrode may be located in the same column, and the first common electrode and the third common electrode may be located in the same row.

This allows greater flexibility in the configuration of the display system.

In the display system according to the one aspect of the present disclosure, for example, the plurality of common electrodes may have a fourth common electrode arranged in the same row or column as that for the first common electrode and the third common electrode, the first common electrode, the third common electrode, and the fourth common electrode may be located within a range that allows for detecting that there has been a touch when the object touches the third common electrode, the display device may include:

a fourth signal line that is connected to the fourth common electrode;

a fourth switch that is connected between the fourth signal line and the first input node and that switches between conduction and non-conduction between the fourth common electrode and the first input node; and a third control signal line that is connected to the fourth switch and switches on and off of the fourth switch.

The third common electrodes 34c_1 according to the first and fourth embodiments and the third common electrode 34ca_1 according to the second embodiment are examples of the fourth common electrode. The third signal lines 36c_1 according to the first and fourth embodiments and the third signal line 36ca_1 according to the second embodiment are examples of the fourth signal line. The third switch SW3_1 according to the first and fourth embodiments and the third switch SW3a_1 according to the second embodiment are examples of the fourth switch.

This case enables faster response to touch detection.

In the display system according to the one aspect of the present disclosure, for example, a frame period in the display device may have three or more display periods for which the display device displays an image and three or more touch detection periods for which the touch detection circuit performs touch detection, and the display periods and the touch detection periods may be alternately arranged within the frame period, the three or more touch detection periods may have a first touch detection period and a second touch detection period, and the touch detection circuit may detect the presence or absence of a touch at the first common electrode during the first touch detection period, may detect the presence or absence of a touch at the fourth common electrode during the second touch detection period, and do no need to detect the presence or absence of a touch at the third common electrode in any of the touch detection periods during the frame period.

This case enables faster response to touch detection.

In the display system according to the one aspect of the present disclosure, for example, the second touch detection period may be the touch detection period following the first touch detection period.

This case enables faster response to touch detection.

In the display system according to the one aspect of the present disclosure, for example, the three or more touch detection periods may further have a third touch detection period after the second touch detection period, and the touch detection circuit may detect the presence or absence of a touch at the first common electrode in the third touch detection period.

This case enables faster response to touch detection.

In the display system according to the one aspect of the present disclosure, for example, a frame period in the display device may have three or more display periods for which the display device displays an image and three or more touch detection periods for which the touch detection circuit detects the presence or absence of a touch, and the display periods and the touch detection periods may be alternately arranged within the frame period, the touch detection circuit may operate by switching between operation in a first mode and operation in a second mode, in the first mode, the touch detection circuit may detect the presence or absence of a touch at the first common electrode, the third common electrode, and the fourth common electrode in a single frame period, and in the second mode, the touch detection circuit may detect a touch at the first common electrode and the fourth common electrode and does not need to detect a touch at the third common electrode in the single frame period.

In this case, the second mode can speed up the touch detection response, and the touch position detection accuracy can be improved in the first mode compared to the second mode.

In the display system according to the one aspect of the present disclosure, for example, the touch detection circuit may switch operation in the second mode to operation in the first mode when a touch is detected at at least one of the first common electrode and the fourth common electrode in the second mode.

In this case, when a touch is detected, the touch position detection accuracy can be improved.

In the display system according to the one aspect of the present disclosure, for example, the touch detection circuit may have:

a first derivation unit that derives a first detection value representing a difference value between the capacitance of the first common electrode and reference capacitance based on the touch detection signal received from the first common electrode, and derives a third detection value representing a difference value between the capacitance of the fourth common electrode and the reference capacitance based on the touch detection signal received from the fourth common electrode;

an interpolation unit that interpolates a second detection value for the third common electrode based on the first detection value and the third detection value when touch detection has not been performed at the third common electrode; and a second derivation unit that derives a touch position based on the first detection value, the second detection value, and the third detection value.

In this case, the touch position detection accuracy in the second mode can be improved.

A display system according to another aspect of the present disclosure includes:

a display device that has a plurality of common electrodes arranged in a matrix and shared for image display and touch detection; and a control device that controls the display device, wherein the control device includes a touch detection circuit that performs detection of the presence or absence of a touch made by an object to the display device, based on a touch detection signal received from each of the plurality of common electrodes, wherein the touch detection circuit includes:

a first A/D conversion circuit that performs A/D conversion on a signal supplied to a first input node, and detects a touch based on a signal A/D converted by the first A/D conversion circuit, wherein the plurality of common electrodes have a first common electrode, a second common electrode, and a third common electrode, wherein one of a set of the first common electrode and the second common electrode and a set of the second common electrode and the third common electrode is arranged in the same column, the other set is arranged in the same row, the first common electrode and the second common electrode are adjacent to each other, and the second common electrode and the third common electrode are adjacent to each other, wherein the display device includes:

a first signal line that is connected to the first common electrode;

a second signal line that is connected to the second common electrode; and a third signal line that is connected to the third common electrode, and wherein the control device includes:

a first switch that is connected between the first signal line and the first input node and that switches between conduction and non-conduction between the first common electrode and the first input node;

a second switch that is connected between the second signal line and the first input node and that switches between conduction and non-conduction between the second common electrode and the first input node;

a third switch that is connected between the third signal line and the first input node and that switches between conduction and non-conduction between the third common electrode and the first input node;

a first control signal line that is connected to the first switch and switches on and off of the first switch; a second control signal line that is connected to the second switch and switches on and off of the second switch; and a third control signal line that is connected to the third switch and switches on and off of the third switch.

The input node N1 according to the third embodiment is an example of the first input node. The A/D conversion circuit 80_1 according to the third embodiment is an example of the first A/D conversion circuit. The first common electrode 34a_1 according to the third embodiment is an example of the first common electrode. The second common electrode 34b_1 according to the third embodiment is an example of the second common electrode. The third common electrode 34c_1 according to the third embodiment is an example of the third common electrode. The first signal line 36a_1 according to the third embodiment is an example of the first signal line. The second signal line 36b_1 according to the third embodiment is an example of the second signal line. The third signal line 36c_1 according to the third embodiment is an example of the third signal line. The first switch SW1_1 according to the third embodiment is an example of the first switch. The second switch SW2_1 according to the third embodiment is an example of the second switch. The third switch SW3_1 according to the third embodiment is an example of the third switch.

According to this aspect, when the first switch, the second switch, and the third switch are made conductive one by one in this order or when the first switch and the third switch are made conductive one by one in this order, if an object touches the second common electrode before the conduction of the third switch after the completion of the conduction of the first switch, the conduction of the third switch allows for detecting that there has been a touch at the third common electrode, thereby allowing for faster response to touch detection. Further, the detection ability can be improved.

In the display system according to the one aspect of the present disclosure, for example,
- a frame period in the display device may have three or more display periods for which the display device displays an image and three or more touch detection periods for which the touch detection circuit performs touch detection, and the display periods and the touch detection periods may be alternately arranged within the frame period,
- the three or more touch detection periods may have a first touch detection period and a second touch detection period, and
- the touch detection circuit may detect the presence or absence of a touch at the first common electrode during the first touch detection period, may detect the presence or absence of a touch at the third common electrode during the second touch detection period, and does not need to detect the presence or absence of a touch at the second common electrode in any of the touch detection periods during the frame period.

This case enables faster response to touch detection.

In the display system according to the one aspect of the present disclosure, for example,
- the second touch detection period may be the touch detection period following the first touch detection period.

This case enables faster response to touch detection.

In the display system according to the one aspect of the present disclosure, for example,
- the three or more touch detection periods may further have a third touch detection period after the second touch detection period, and
- the touch detection circuit may detect the presence or absence of a touch at the first common electrode in the third touch detection period.

In this case, when an object touches the first common electrode after the end of the first touch detection period, the touch can be detected during the third touch detection period, and faster response to touch detection is thus enabled.

In the display system according to the one aspect of the present disclosure, for example,
- a frame period in the display device may have three or more display periods for which the display device displays an image and three or more touch detection periods for which the touch detection circuit detects the presence or absence of a touch, and the display periods and the touch detection periods may be alternately arranged within the frame period,
- the touch detection circuit may operate by switching between operation in a first mode and operation in a second mode,
- in the first mode, the touch detection circuit may detect the presence or absence of a touch at the first common electrode, the second common electrode, and the third common electrode in a single frame period, and
- in the second mode, the touch detection circuit may detect a touch at the first common electrode and the third common electrode and does not need to detect a touch at the second common electrode in the single frame period.

In this case, the second mode can speed up the touch detection response, and the touch position detection accuracy can be improved in the first mode compared to the second mode.

In the display system according to the one aspect of the present disclosure, for example,
- the touch detection circuit may switch operation in the second mode to operation in the first mode when a touch is detected at at least one of the first common electrode and the third common electrode in the second mode.

In this case, when a touch is detected, the touch position detection accuracy can be improved.

In the display system according to the one aspect of the present disclosure, for example,
- the touch detection circuit may have:
  - a first derivation unit that derives a first detection value representing a difference value between the capacitance of the first common electrode and reference capacitance based on the touch detection signal received from the first common electrode, and derives a third detection value representing a difference value between the capacitance of the third common electrode and the reference capacitance based on the touch detection signal received from the third common electrode;
  - an interpolation unit that interpolates a second detection value for the second common electrode based on the first detection value and the third detection value when touch detection has not been performed at the second common electrode; and
  - a second derivation unit that derives a touch position based on the first detection value, the second detection value, and the third detection value.

In this case, the touch position detection accuracy in the second mode can be improved.

In the display system according to the one aspect of the present disclosure, for example,
- the touch detection circuit may be located on the upper or lower side of the plurality of common electrodes in a plane view.

In this case, the degree of freedom in the arrangement of the touch detection circuit can be improved.

In the display system according to the one aspect of the present disclosure, for example,
- the touch detection circuit may be located on the left or right side of the plurality of common electrodes in a plane view.

In this case, the degree of freedom in the arrangement of the touch detection circuit can be improved.

A display system according to another aspect of the present disclosure includes:
- a display device that has a plurality of common electrodes arranged in a matrix and shared for image display and touch detection; and
- a touch detection circuit that performs detection of a touch made by an object to the display device, based on a touch detection signal received from each of the plurality of common electrodes, wherein the plurality of common electrodes have a first common electrode, a second common electrode, and a third common electrode, the first common electrode, the second common electrode, and the third common electrode are located within a range that allows for detecting that there has been a touch at each of the first common electrode, the second common electrode, and the third common electrode when the object touches the second common electrode, the display device includes a first signal line connected to the first common electrode, a second signal line connected to the second common electrode, and a third signal line connected to the third common electrode, and the touch detection circuit includes:

a first A/D conversion circuit that performs A/D conversion on a signal supplied to a first input node;

a first switch that is connected between the first signal line and the first input node and that switches between conduction and non-conduction between the first common electrode and the first input node;

a second switch that is connected between the second signal line and the first input node and that switches between conduction and non-conduction between the second common electrode and the first input node; and a third switch that is connected between the third signal line and the first input node and that switches between conduction and non-conduction between the third common electrode and the first input node, and the touch detection circuit detects a touch based on a signal A/D converted by the first A/D conversion circuit.

According to this aspect, when the first switch, the second switch, and the third switch are made conductive one by one in this order or when the first switch and the third switch are made conductive one by one in this order, if an object touches the second common electrode before the conduction of the third switch after the completion of the conduction of the first switch, the conduction of the third switch allows for detecting that there has been a touch at the third common electrode, thereby allowing for faster response to touch detection.

In the display system according to the one aspect of the present disclosure, for example, the second common electrode may be adjacent to the first common electrode, and the third common electrode may be adjacent to the second common electrode.

In this case, the capacitance of each of the first common electrode and the third common electrode can be changed when an object touches the second common electrode.

In the display system according to the one aspect of the present disclosure, for example, the first common electrode, the second common electrode, and the third common electrode may be located in the same row.

This allows greater flexibility in the configuration of the display system.

In the display system according to the one aspect of the present disclosure, for example, the first common electrode, the second common electrode, and the third common electrode may be located in the same column.

This allows greater flexibility in the configuration of the display system.

In the display system according to the one aspect of the present disclosure, for example, the touch detection circuit may be located on the upper or lower side of the plurality of common electrodes in a plane view.

In this case, the degree of freedom in the arrangement of the touch detection circuit can be improved.

In the display system according to the one aspect of the present disclosure, for example, the touch detection circuit may be located on the left or right side of the plurality of common electrodes in a plane view.

In this case, the degree of freedom in the arrangement of the touch detection circuit can be improved.

In the display system according to the one aspect of the present disclosure, for example, the first common electrode and the second common electrode may be located in the same row, and the second common electrode and the third common electrode may be located in the same column.

In this case, it is possible to improve the detection performance.

In the display system according to the one aspect of the present disclosure, for example, the first common electrode and the second common electrode may be located in the same column, and the second common electrode and the third common electrode may be located in the same row.

In this case, it is possible to improve the detection performance.

In the display system according to the one aspect of the present disclosure, for example, a frame period in the display device may have three or more display periods for which the display device displays an image and three or more touch detection periods for which the touch detection is performed in the touch detection period, and the display periods and the touch detection periods may be alternately arranged within the frame period, the three or more touch detection periods have a first touch detection period and a second touch detection period, and the touch detection circuit may detect a touch at the first common electrode during the first touch detection period, may detect a touch at the third common electrode during the second touch detection period, and may not detect a touch at the second common electrode in any of the touch detection periods during the frame period.

This case enables faster response to touch detection.

In the display system according to the one aspect of the present disclosure, for example, the second touch detection period may be the touch detection period following the first touch detection period.

This case enables faster response to touch detection.

In the display system according to the one aspect of the present disclosure, for example, the three or more touch detection periods may further have a third touch detection period after the second touch detection period, and the touch detection circuit may detect a touch at the first common electrode in the third touch detection period.

In this case, when an object touches the first common electrode after the end of the first touch detection period, the touch can be detected during the third touch detection period, and faster response to touch detection is thus enabled.

In the display system according to the one aspect of the present disclosure, for example, a frame period in the display device may have three or more display periods for which the display device displays an image and three or more touch detection periods for which the touch detection is performed in the touch detection period, and the display periods and the touch detection periods may be alternately arranged within the frame period, the touch detection circuit may operate by switching between operation in a first mode and operation in a second mode, in the first mode, the touch detection circuit may detect a touch at the first common electrode, the second common electrode, and the third common electrode in a single frame period, and in the second mode, the touch detection circuit may detect a touch at the first common electrode and the third common electrode and may not detect a touch at the second common electrode in the single frame period.

In this case, the second mode can speed up the touch detection response, and the touch position detection accuracy can be improved in the first mode compared to the second mode.

In the display system according to the one aspect of the present disclosure, for example, the touch detection circuit may switch operation in the second mode to operation in the first mode when a touch is detected at at least one of the first common electrode and the third common electrode in the second mode.

In this case, when a touch is detected, the touch position detection accuracy can be improved.

In the display system according to the one aspect of the present disclosure, for example, the touch detection circuit may have:

a first derivation unit that derives a first detection value representing a difference value between the capacitance of the first common electrode and reference capacitance based on the touch detection signal received from the first common electrode, and derives a third detection value representing a difference value between the capacitance of the third common electrode and the reference capacitance based on the touch detection signal received from the third common electrode;

an interpolation unit that interpolates a second detection value for the second common electrode based on the first detection value and the third detection value when touch detection has not been performed at the second common electrode; and a second derivation unit that derives a touch position based on the first detection value, the second detection value, and the third detection value.

In this case, the touch position detection accuracy in the second mode can be improved.

In the display system according to the one aspect of the present disclosure, for example, the plurality of common electrodes may have a fourth common electrode, a fifth common electrode, and a sixth common electrode, the fourth common electrode may be adjacent to the first common electrode, the second common electrode may be adjacent to the fourth common electrode, the fifth common electrode may be adjacent to the second common electrode, the third common electrode may be adjacent to the fifth common electrode, the sixth common electrode may be adjacent to the third common electrode, the display device may include a fourth signal line connected to the fourth common electrode, a fifth signal line connected to the fifth common electrode, and a sixth signal line connected to the sixth common electrode, the touch detection circuit may include:

a second A/D conversion circuit that performs A/D conversion on a signal supplied to a second input node;

a fourth switch that is connected between the fourth signal line and the second input node and that switches between conduction and non-conduction between the fourth common electrode and the second input node;

a fifth switch that is connected between the fifth signal line and the second input node and that switches between conduction and non-conduction between the fifth common electrode and the second input node; and a sixth switch that is connected between the sixth signal line and the second input node and that switches between conduction and non-conduction between the sixth common electrode and the second input node, and the touch detection circuit may detect a touch based on signals A/D converted respectively by the first A/D conversion circuit and the second A/D conversion circuit.

In this case, when a set of the first switch and the fourth switch, a set of the second switch and the fifth switch, and a set of the third switch and the sixth switch are made conductive two switches at a time in this order or when a set of the first switch and the fourth switch and a set of the third switch and the sixth switch are made conductive two switches at a time in this order, if an object touches the second common electrode before the conduction of the third switch and the sixth switch after the end of the conduction of the first switch and the fourth switch, the conduction of the third switch and the sixth switch allows for detecting that there has been a touch at the third common electrode, thereby allowing for faster response to touch detection.

A control device according to the one aspect of the present disclosure is a control device that controls a display device having a plurality of common electrodes arranged in a matrix and shared for image display and touch detection, including:

a touch detection circuit that performs detection of a touch made by an object to the display device, based on a touch detection signal received from each of the plurality of common electrodes, wherein the plurality of common electrodes have a first common electrode, a second common electrode, and a third common electrode, the first common electrode, the second common electrode, and the third common electrode are located within a range that allows for detecting that there has been a touch at each of the first common electrode, the second common electrode, and the third common electrode when the object touches the second common electrode, the display device includes a first signal line connected to the first common electrode, a second signal line connected to the second common electrode, and a third signal line connected to the third common electrode, wherein the touch detection circuit includes:

a first A/D conversion circuit that performs A/D conversion on a signal supplied to a first input node;

a first switch that is connected between the first signal line and the first input node and that switches between conduction and non-conduction between the first common electrode and the first input node;
a second switch that is connected between the second signal line and the first input node and that switches between conduction and non-conduction between the second common electrode and the first input node; and
a third switch that is connected between the third signal line and the first input node and that switches between conduction and non-conduction between the third common electrode and the first input node,
the touch detection circuit detects a touch based on a signal A/D converted by the first A/D conversion circuit.

According to the aspect, faster response to touch detection is enabled.

While various embodiments have been described herein above, it is to be appreciated that various changes in form and detail may be made without departing from the spirit and scope of the invention(s) presently or hereafter claimed.

CROSS-REFERENCE TO RELATED APPLICATIONS

This application is a Continuation of International Application No. PCT/JP2022/039870, filed on Oct. 26, 2022, which in turn claims the benefit of Japanese Application No. 2021-186361, filed on Nov. 16, 2021, the disclosures of which Applications are incorporated by reference herein.

What is claimed is:

1. A display system comprising:
a display device that includes a plurality of common electrodes arranged in a matrix and shared for image display and touch detection; and
a control device that controls the display device, wherein
the control device includes a touch detection circuit that performs detection of a presence or absence of a touch made by an object to the display device, based on a touch detection signal received from each of the plurality of common electrodes,
the touch detection circuit includes:
a first A/D conversion circuit that performs A/D conversion on a signal supplied to a first input node; and
a second A/D conversion circuit that performs A/D conversion on a signal supplied to a second input node, and that detects the presence or absence of a touch based on a signal A/D converted by the first A/D conversion circuit and a signal A/D converted by the second A/D conversion circuit,
the plurality of common electrodes include a first common electrode, a second common electrode, and a third common electrode,
one of a set of the first common electrode and the second common electrode and an other set of the first common electrode and the third common electrode is arranged in a same column, the other set is arranged in a same row, and the electrodes in at least one of the set of the first common electrode and the second common electrode and the other set of the first common electrode and the third common electrode are adjacent to each other,
the display device includes:
a first signal line that is connected to the first common electrode;
a second signal line that is connected to the second common electrode; and
a third signal line that is connected to the third common electrode, and the control device includes:
a first switch that is connected between the first signal line and the first input node and that switches between conduction and non-conduction between the first common electrode and the first input node;
a second switch that is connected between the second signal line and the second input node and that switches between conduction and non-conduction between the second common electrode and the second input node;
a third switch that is connected between the third signal line and the first input node and that switches between conduction and non-conduction between the third common electrode and the first input node;
a first control signal line that is directly connected to the first switch and the second switch and that switches on and off of the first switch and on and off of the second switch; and
a second control signal line that is connected to the third switch and that switches on and off of the third switch.

2. The display system according to claim 1, wherein the first common electrode and the second common electrode are adjacent to each other, and the first common electrode and the third common electrode are adjacent to each other.

3. The display system according to claim 1, wherein the first common electrode and the second common electrode are located in the same row, and the first common electrode and the third common electrode are located in the same column.

4. The display system according to claim 1, wherein the first common electrode and the second common electrode are located in the same column, and the first common electrode and the third common electrode are located in the same row.

5. The display system according to claim 1, wherein the plurality of common electrodes include a fourth common electrode arranged in the same row or the same column as that for the first common electrode and the third common electrode,
the first common electrode, the third common electrode, and the fourth common electrode are located within a range that allows for detecting that there has been the touch when the object touches the third common electrode, and
the display device further includes:
a fourth signal line that is connected to the fourth common electrode;
a fourth switch that is connected between the fourth signal line and the first input node and that switches between conduction and non-conduction between the fourth common electrode and the first input node; and
a third control signal line that is connected to the fourth switch and that switches on and off of the fourth switch.

6. The display system according to claim 5, wherein a frame period in the display device includes three or more display periods for which the display device displays an image and three or more touch detection periods for which the touch detection circuit performs the touch detection, and the display periods and the touch detection periods are alternately arranged within the frame period, the three or more touch detection periods include a first touch detection period and a second touch detection period, and the touch detection circuit detects the presence or absence of the touch at the first common electrode during the first touch detection period, detects the presence or absence of the touch at the fourth common electrode during the second touch detection period, and does not detect the presence or absence of the touch at the third common electrode in any of the touch detection periods during the frame period.

7. The display system according to claim 6, wherein the second touch detection period follows the first touch detection period.

8. The display system according to claim 7, wherein the three or more touch detection periods further include a third touch detection period after the second touch detection period, and the touch detection circuit detects the presence or absence of the touch at the first common electrode in the third touch detection period.

9. The display system according to claim 5, wherein a frame period in the display device includes three or more display periods for which the display device displays an image and three or more touch detection periods for which the touch detection circuit detects the presence or absence of the touch, and the display periods and the touch detection periods are alternately arranged within the frame period, the touch detection circuit operates by switching between operation in a first mode and operation in a second mode, in the first mode, the touch detection circuit detects the presence or absence of the touch at the first common electrode, the third common electrode, and the fourth common electrode in a single frame period, and in the second mode, the touch detection circuit detects the touch at the first common electrode and the fourth common electrode and does not detect the touch at the third common electrode in the single frame period.

10. The display system according to claim 9, wherein the touch detection circuit switches the operation in the second mode to the operation in the first mode when the touch is detected at the least one of the first common electrode and the fourth common electrode in the second mode.

11. The display system according to claim 5, wherein the touch detection circuit further includes:
a memory in which a program is stored; and
a processor coupled to the memory and configured to perform processing by executing the program, the processing including:
deriving a first detection value representing a difference value between a capacitance of the first common electrode and a reference capacitance based on the touch detection signal received from the first common electrode, and deriving a third detection value representing a difference value between a capacitance of the fourth common electrode and the reference capacitance based on the touch detection signal received from the fourth common electrode;
interpolating a second detection value for the third common electrode based on the first detection value and the third detection value when touch detection has not been performed at the third common electrode; and
deriving a touch position based on the first detection value, the second detection value, and the third detection value.

12. The display system according to claim 1, wherein the touch detection circuit is located on an upper or lower side of the plurality of common electrodes in a plane view.

13. The display system according to claim 1, wherein the touch detection circuit is located on a left or right side of the plurality of common electrodes in a plane view.

14. A display system comprising:
a display device that includes a plurality of common electrodes arranged in a matrix and shared for image display and touch detection; and
a control device that controls the display device, wherein
the control device includes a touch detection circuit that performs detection of a presence or absence of a touch made by an object to the display device, based on a touch detection signal received from each of the plurality of common electrodes,
the touch detection circuit includes:
a first A/D conversion circuit that performs A/D conversion on a signal supplied to a first input node, and detects a touch based on a signal A/D converted by the first A/D conversion circuit,
the plurality of common electrodes include a first common electrode, a second common electrode, and a third common electrode,
one of a set of the first common electrode and the second common electrode and an other set of the second common electrode and the third common electrode is arranged in a same column, the other set is arranged in a same row, the first common electrode and the second common electrode are adjacent to each other, and the other set of second common electrode and the third common electrode are adjacent to each other,
the display device includes:
a first signal line that is connected to the first common electrode;
a second signal line that is connected to the second common electrode; and
a third signal line that is connected to the third common electrode, and
the control device includes:
a first switch that is connected between the first signal line and the first input node and that switches between conduction and non-conduction between the first common electrode and the first input node;
a second switch that is connected between the second signal line and the first input node and that switches between conduction and non-conduction between the second common electrode and the first input node;
a third switch that is connected between the third signal line and the first input node and that switches between conduction and non-conduction between the third common electrode and the first input node;
a first control signal line that is connected to the first switch and switches on and off of the first switch;
a second control signal line that is connected to the second switch and switches on and off of the second switch;
a third control signal line that is connected to the third switch and switches on and off of the third switch; and
the first A/D conversion circuit performs A/D conversion on a signal supplied from the first common electrode, the second common electrode, and the third common electrode.

15. The display system according to claim 14, wherein
a frame period in the display device includes three or more display periods for which the display device displays an image and three or more touch detection periods for which the touch detection circuit performs the touch detection, and the display periods and the touch detection periods are alternately arranged within the frame period,
the three or more touch detection periods include a first touch detection period and a second touch detection period,
the touch detection circuit detects the presence or absence of the touch at the first common electrode during the first touch detection period, detects the presence or absence of the touch at the third common electrode during the second touch detection period, and does not detect the presence or absence of the touch at the second common electrode in any of the touch detection periods during the frame period.

16. The display system according to claim 15, wherein
the second touch detection period is follows the first touch detection period.

17. The display system according to claim 16, wherein
the three or more touch detection periods further include a third touch detection period after the second touch detection period, and
the touch detection circuit detects the presence or absence of the touch at the first common electrode in the third touch detection period.

18. The display system according to claim 14, wherein
a frame period in the display device includes three or more display periods for which the display device displays an image and three or more touch detection periods for which the touch detection circuit detects the presence or absence of the touch, and the display periods and the touch detection periods are alternately arranged within the frame period,
the touch detection circuit operates by switching between operation in a first mode and operation in a second mode,
in the first mode, the touch detection circuit detects the presence or absence of the touch at the first common electrode, the second common electrode, and the third common electrode in a single frame period, and
in the second mode, the touch detection circuit detects the touch at the first common electrode and the third common electrode and does not detect the touch at the second common electrode in the single frame period.

19. The display system according to claim 18, wherein
the touch detection circuit switches the operation in the second mode to the operation in the first mode when the touch is detected at the least one of the first common electrode and the third common electrode in the second mode.

20. The display system according to claim 14, wherein
the touch detection circuit further includes:
a memory in which a program is stored; and
a processor coupled to the memory and configured to perform processing by executing the program, the processing including:
deriving a first detection value representing a difference value between a capacitance of the first common electrode and reference capacitance based on the touch detection signal received from the first common electrode, and deriving a third detection value representing a difference value between a capacitance of the third common electrode and the reference capacitance based on the touch detection signal received from the third common electrode;
interpolating a second detection value for the second common electrode based on the first detection value and the third detection value when touch detection has not been performed at the second common electrode; and
deriving a touch position based on the first detection value, the second detection value, and the third detection value.

21. A display system comprising:
a display device that includes a plurality of common electrodes arranged in a matrix and shared for image display and touch detection; and
a control device that controls the display device, wherein
the control device includes a touch detection circuit that performs detection of a presence or absence of a touch made by an object to the display device, based on a touch detection signal received from each of the plurality of common electrodes,
the touch detection circuit includes:
a first A/D conversion circuit that performs A/D conversion on a signal supplied to a first input node; and
a second A/D conversion circuit that performs A/D conversion on a signal supplied to a second input node, and that detects the presence or absence of a touch based on a signal A/D converted by the first A/D conversion circuit and a signal A/D converted by the second A/D conversion circuit,
the plurality of common electrodes include a first common electrode, a second common electrode, a third common electrode, and a fourth common electrode,
one of a set of the first common electrode and the second common electrode and an other set of the first common electrode and the third common electrode is arranged in a same column, the other set is arranged in a same row, and the electrodes in at least one of the set of the first common electrode and the second common electrode and the other set of the first common electrode and the third common electrode are adjacent to each other,
the fourth common electrode is arranged in the same row or the same column as that for the first common electrode and the third common electrode,
the first common electrode, the third common electrode, and the fourth common electrode are located within a range that allows for detecting that there has been a touch when the object touches the third common electrode,
the display device includes:
a first signal line that is connected to the first common electrode;
a second signal line that is connected to the second common electrode; and a third signal line that is connected to the third common electrode; and
a fourth signal line that is connected to the fourth common electrode; and
the control device includes:
a first switch that is connected between the first signal line and the first input node and that switches between conduction and non-conduction between the first common electrode and the first input node;
a second switch that is connected between the second signal line and the second input node and that switches between conduction and non-conduction between the second common electrode and the second input node;

a third switch that is connected between the third signal line and the first input node and that switches between conduction and non-conduction between the third common electrode and the first input node;

a fourth switch that is connected between the fourth signal line and the first input node and that switches between conduction and non-conduction between the fourth common electrode and the first input node;

a first control signal line that is directly connected to the first switch and the second switch and that switches on and off of the first switch and on and off of the second switch;

a second control signal line that is connected to the third switch and that switches on and off of the third switch; and a third control signal line that is connected to the fourth switch and switches on and off of the fourth switch;

a frame period in the display device has three or more display periods for which the display device displays an image and three or more touch detection periods for which the touch detection circuit performs touch detection, and the display periods and the touch detection periods are alternately arranged within the frame period, the three or more touch detection periods have a first touch detection period, a second touch detection period, and a third touch detection period, the three or more display periods have a first display period, a second display period, and a third display period, the frame period has the first display period, the first touch detection period, the second display period, the second touch detection period, the third display period and the third touch detection period in order, and the touch detection circuit detects the presence or absence of a touch at the first common electrode during the first touch detection period and the third touch detection period, detects the presence or absence of the touch at the fourth common electrode during the second touch detection period, and does not detect the presence or absence of the touch at the third common electrode in any of the first touch detection period, the second touch detection period and the third touch detection period.

* * * * *